United States Patent
Shibuya et al.

(10) Patent No.: US 6,515,324 B2
(45) Date of Patent: Feb. 4, 2003

(54) CAPACITOR, CAPACITOR MOUNTING STRUCTURE, METHOD FOR MANUFACTURING SAME, SEMICONDUCTOR DEVICE, AND METHOD FOR MANUFACTURING SAME

(75) Inventors: Akinobu Shibuya, Tokyo (JP); Shintaro Yamamichi, Tokyo (JP); Toru Mori, Tokyo (JP); Takao Yamazaki, Tokyo (JP); Yuzo Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/942,817

(22) Filed: Aug. 30, 2001

(65) Prior Publication Data

US 2002/0070400 A1 Jun. 13, 2002

(30) Foreign Application Priority Data

Sep. 8, 2000 (JP) ........................................ 2000-274016

(51) Int. Cl.⁷ ...................... H01L 27/178; H01L 31/119
(52) U.S. Cl. ........................ 257/296; 257/297; 257/300
(58) Field of Search ................................. 257/296, 297, 257/422, 300

(56) References Cited

U.S. PATENT DOCUMENTS 5,625,944 A * 5/1997 Werther

FOREIGN PATENT DOCUMENTS

| EP | 0361900 A2 * | 4/1990 |
|---|---|---|
| JP | 02-203595 | 8/1990 |
| JP | 04-211191 | 8/1992 |
| JP | 08-097360 | 4/1996 |
| JP | 8-241830 | 9/1996 |
| JP | 09-223719 | 8/1997 |
| JP | 9-270367 | 10/1997 |
| JP | 10-112472 | 4/1998 |
| JP | 11-045822 | 2/1999 |
| JP | 11-214250 | 8/1999 |

OTHER PUBLICATIONS

"Stacked Capacitors Having a New Structure Suppress Power Fluctuations in LSI Devices Operating at 1 GHz" Nikkei Electronics, Apr. 19, 1999 (No. 741), 144–156.

* cited by examiner

Primary Examiner—Stephen D. Meier
(74) Attorney, Agent, or Firm—Katten, Muchin, Zavis & Rosenman

(57) ABSTRACT

A capacitor has a lower electrode, a dielectric thin film, an upper electrode, and an insulation cover layer formed on an insulation substrate made of an organic film or a ceramic material, and through holes formed at positions corresponding to input and output pads of a semiconductor element or to input and output terminals of a semiconductor package, with electrodes for connection to input and output pads of a semiconductor element or to input and output terminals of a semiconductor package provided within through holes. In a method for mounting the capacitor, the capacitor is interposed between a flip-chip connected semiconductor element and a mounting substrate.

22 Claims, 20 Drawing Sheets

CAPACITOR, CAPACITOR MOUNTING STRUCTURE, METHOD FOR MANUFACTURING SAME, SEMICONDUCTOR DEVICE, AND METHOD FOR MANUFACTURING SAME

BACKGROUND OF THE INVENTION

1. Field of the Invention

The present invention relates to a capacitor component used in a semiconductor device, and more particularly to a capacitor structure, to a mounting structure of a capacitor and a semiconductor element, and to a method for manufacturing same.

2. Related Art

In the past, many capacitors have been mounted in the area surrounding an LSI device on mounting board on which semiconductor elements are mounted, in order to prevent generating of noise.

When a clock signal changing at a high frequency is generated from an LSI device, because of the resistance R and inductance L existing in the wiring between the power supply and the LSI device, a voltage drop $\Delta V$, given by the following equation (1), occurs.

$$\Delta V = R \times \Delta i + L \times di/dt \tag{1}$$

In above relationship, R is the resistance of the wiring and the capacitor, L is the inductance thereof, and $\Delta i$ is the change in current during the time $\Delta t$.

Therefore, the larger R, L, and the load change di are, or the smaller the time change dt is, the greater will be the increase in the voltage drop $\Delta V$. In recent years, the clock frequency of LSI devices has reached to high speed such as hundreds of megahertz. The rise time tr of pulse waveforms in digital circuitry is now equivalent to the change time dt of the load. Because the higher the clock frequency is, the shorter is the rise time tr, the larger will be the voltage drop $\Delta V$.

In order to make this voltage drop smaller, it is effective to connect a capacitor parallel between the LSI power line and the ground line, this capacitor generally being referred to as a decoupling capacitor. As the LSI device clock frequency increases, because the temporarily decreased voltage when there is a load change cannot be sufficiently compensated for by the power supply, a charge is supplied from a decoupling capacitor connected close to the LSI device to provide this compensation. However, because of the influence of the capacitor's equivalent series resistance (ESR), equivalent series inductance (ESL), and the wiring resistance Rl and wiring inductance L1 in the wiring from the capacitor to the LSI device, the voltage drop $\Delta V$ of Equation (1) occurs.

Additionally, because of the existence of ESR, ESL, R1, and L1 in the circuit, at some frequency an LC resonance occurs, the result being that the capacitor fails to function as a capacitor at higher frequencies than that above-mentioned. Thus, in addition to an increase the LSI device clock frequency, it is necessary to increase the LC resonant frequency f of the decoupling capacitor. The LC resonant frequency f is given by the following Equation (2).

$$f^2 = 1/(4\pi^2 \times L \times C) \tag{2}$$

For this reason, it is necessary to select as a decoupling capacitor a capacitor having a small value of C and a small value of L. A commonly used decoupling capacitor is a multilayer ceramic capacitor having a capacitance of 0.1 $\mu$F or smaller, having relatively good high-frequency characteristics. A multilayer ceramic capacitor has ESR being smaller than that of an electrolytic capacitor, and also has the advantage having a smaller value of ESL. However, because the capacitance value C thereof is small, it is necessary to connect a large number of capacitors in parallel in order to achieve the required charge. However, since by merely connecting capacitors in parallel, the resonance frequency f cannot be changed, it was not possible to achieve sufficient characteristics as a decoupling capacitor because of R1 and L1 in the wiring from the capacitors to the LSI device.

Taking the example of a multiplayer ceramic capacitor commonly used as a decoupling capacitor in the past to compensate for the LSI device voltage drop, even if the values of resistance R and inductance L of the wiring is ignored, the value of capacitance C is 0.01 $\mu$F and the value of ESL is 0.4 nH. Therefore, from Equation (2), it was not possible to achieve a resonant frequency f for this capacitor higher than approximately 80 MHz.

As described in the Apr. 19, 1999 issue of Nikkei Electronics (pp 144–156), it is known that as the thickness of the dielectric is reduced, the ESL is also reduced. From this fact, there have been several reports of inventions related to semiconductor devices using a thin-film capacitor (For example, Japanese Unexamined patent publication (KOKAI) No. 11-45822 and Japanese Unexamined patent publication (KOKAI) No. H8-97360. However, these did not solve the problem of the voltage drop $\Delta V$ occurring because of the wiring resistance R1 and inductance L1 between the capacitor and the LSI device.

On the other hand, a mounting board with thin-film capacitors formed in the surface for mounting semiconductor elements so as to reduce the above-noted R1 and L1 of a wire is reported in the Japanese Unexamined patent publication (KOKAI) No. H2-203595 and Japanese Unexamined patent publication (KOKAI) No. H4-211191.

In these, however, there is the problem that there is a restriction to ceramic boards, which can withstand high temperatures encountered in fabricating the thin-film capacitors. Another problem is that a low manufacturing yield thereof was low. In Japanese Unexamined patent publication (KOKAI) No. H9-223719, there is a report of a semiconductor device in which a thin-film capacitor is formed on a surface other than a surface on which semiconductor elements are mounted. This, however, does not sufficiently reduce the values of R1 and L1 of the wiring.

As is clear from the above, in the past there was the problem of not being able to achieve sufficient frequency characteristics in capacitor components. Additionally, even in a thin-film capacitor with superior high-frequency characteristics, because of the wiring R1 and L1 between the capacitor and the LSI device, overall effective characteristics at high frequencies were insufficient. With a mounting board on which a thin-film capacitor is formed on a surface on which semiconductor elements are mounted, there is the problem of poor manufacturing yield, and the additional problems of restriction to the use of a ceramic board, and of insufficient frequency characteristics.

Accordingly, in order to solve the above-described problems, it is an object of the present invention to provide a capacitor component connected to a semiconductor element without intervening wiring, or a capacitor component connected between a flip-chip connected semiconductor element and a board. It is a further object of the present invention to provide a method for manufacturing the above-noted capacitor components. It is yet another object of the present invention to provide a semiconductor element to which a capacitor is connected, a package with a built-in capacitor or a chip-size package (CSP) with a built-in capacitor, and further to provide a method for manufacturing same. It is yet another object of the present invention to provide a structure wherein a capacitor is mounted in a space between a flip-chip connected semiconductor element and a board.

SUMMARY OF THE INVENTION

To achieve the above-noted objects, the present invention adopts the following described technical constitution.

Specifically, a capacitor according to the present invention is a capacitor used associated with a semiconductor element, this capacitor being formed by the successive laminations of a lower electrode, a dielectric thin film, an upper electrode, and an insulation cover onto an insulating substrate in this order, a plurality of through holes each being formed through the insulation substrate, the lower electrode, the dielectric thin film, the upper electrode, and the insulation cover, at positions corresponding to the input and output pads of the semiconductor element, and within a part of the plurality of through holes, either the lower electrode or the upper electrode is exposed for the purpose of connecting the input and output pads of the semiconductor element.

The above-noted insulation substrate can be made of an organic film, and can also be made of ceramic.

It is desirable that either one of the lower electrode and the upper electrode serves as a power supply plane, the other of the lower electrode and the upper electrode serving as the ground plane, and that the power supply plane and the ground plane are exposed within the through holes located at the positions each corresponding to the positions of the power and ground pads, respectively, of the semiconductor element, and that neither the lower electrode nor the upper electrode are exposed within through holes located at positions corresponding to the signal pads of the semiconductor element. It is possible to provide a dummy electrode within these through holes, which is electrically connected to neither the lower electrode nor the upper electrode. Alternatively, it is possible to provide a dummy electrode connected via a resistor to at least one of the lower electrode and the upper electrode.

It is possible to apply an adhesive to at least one of the front or rear surface of a capacitor according to the present invention.

It is possible to form a plurality of through holes at positions corresponding to positions of input and -output terminals of a semiconductor package instead of the input and output pads of the semiconductor element. In this case, the input and output terminals of the semiconductor package corresponding to the through holes can be a BGA (ball grid array) pads of a CSP (chip-size package).

It is further possible to form within the through holes a joining material for the purpose of joining the material with the input and output pads of the semiconductor element.

A semiconductor device according to the present invention has a capacitor according to the present invention connected by the above-noted joining material via either the lower electrode or the upper electrode within the through hole.

It is also possible to fill the space between the semiconductor element and the capacitor using an undersell resin, and further possible to seal the semiconductor element using a molded resin.

It is possible make the package a CSP. It is further possible to have the capacitor according to the present invention connected by the joining material via either the lower electrode or the upper electrode within the through hole to input and output terminals of the semiconductor package.

A capacitor mounting structure according to the present invention has a capacitor according to the present invention interposed between a semiconductor element and a mounting substrate, and connected by a joining material via either a lower electrode or an upper electrode within the through hole to both the semiconductor element and the mounting substrate.

In the above case, it is desirable that the spaces formed among the semiconductor element, the capacitor, and the mounting substrate be filled with underfill resin.

It is also possible for a capacitor according to the present invention to be interposed between a package and a mounting substrate, and to be connected by a joining material via either a lower electrode or an upper electrode to both the package and the mounting substrate.

It is possible to use solder, a metallic bump, an electrically conductive adhesive, or an electrically anisotropic conductive resin as the above-noted joining material.

Additionally, it is possible a capacitor according to the present invention to be interposed between a semiconductor element and a mounting substrate, and be connected to both the semiconductor element and the mounting substrate by a joining material via either a lower electrode or an upper electrode within the through hole, with an adhesive applied to the front and the rear surfaces of the capacitor serving also as an underfill resin or a sealing resin.

A method for manufacturing a capacitor according to the present invention has a step of forming an organic film on a wafer, a step of forming a film for the lower electrode, a step of patterning that film, a step of forming a dielectric thin film, a step of patterning that film, a step of forming a film for the upper electrode, a step of patterning that film, and wherein a step of peeling the organic film from the wafer carried out after when the above-noted steps had been done.

Additionally, it is possible to add a step of applying the adhesive.

Another method for manufacturing a capacitor of the present invention comprises a step of forming a lower electrode film, a step of patterning that film, a step of forming a dielectric thin film, a step of patterning that film, a step of forming an upper electrode film, a step of patterning that film, and wherein the capacitor of the present invention is produced with a roll-to-roll method.

Additionally, it is possible to add a step of applying the adhesive.

A method for manufacturing a semiconductor device according to the present invention has a step of forming an organic film on a wafer, a step of forming a lower electrode film, a step of patterning that film, a step of forming a dielectric thin film, a step of patterning that film, forming an upper electrode film, a step of patterning that film, a step of connecting a semiconductor element to the capacitor, and wherein a step of peeling the organic film from the wafer carried out after when the above-noted steps had been done.

It is possible to have an additional step of underfilling or molding, in this method.

Another method for manufacturing a semiconductor device according to the present invention is a roll-to-roll organic film manufacturing method, which includes a step of forming a lower electrode film, a step of patterning that film, a step of forming a dielectric thin film, a step of patterning that film, a step of forming an upper electrode film, a step of patterning that film, and a step of connecting a semiconductor element to the capacitor. It is possible to have an additional step of underfilling or molding.

It is further possible to include steps of distributing a joining material to the through hole, and connecting the semiconductor element.

DETAILED DESCRIPTION OF THE PREFERRED EMBODIMENTS

Embodiments of the present invention, which solve the above-described problems of the prior art, are described in detail below, with references made to relevant accompanying drawings.

Figure 1:
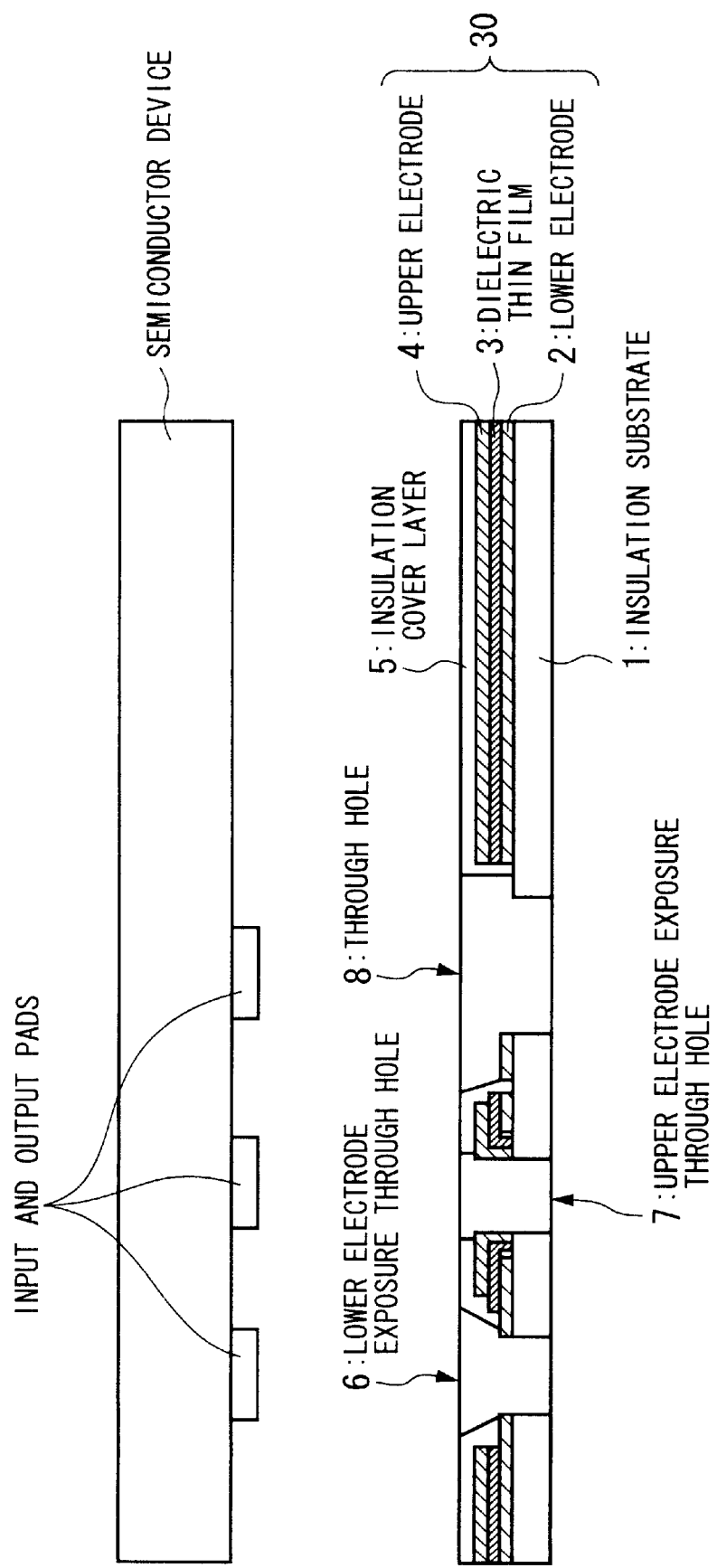
FIG. 1 is a structural cross-sectional view of a capacitor, illustrating an embodiment of the present invention.
Figure 2:
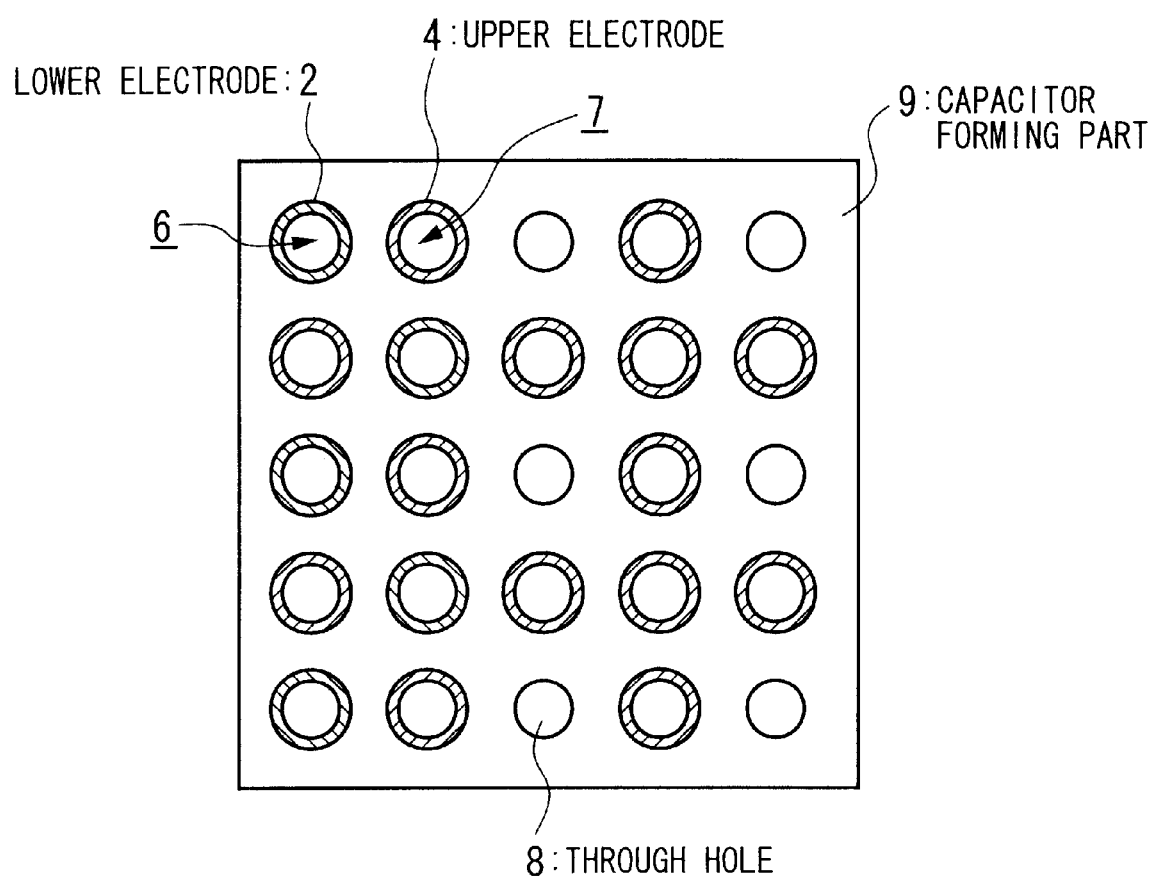
FIG. 2 is a structural plane view of a capacitor, illustrating an embodiment of the present invention.

A first embodiment of the present invention is a capacitor having the structure shown in FIG. 1 and FIG. 2. FIG. 1 shows this as a cross-sectional view, while FIG. 2 shows this as a plan view.

In a capacitor according to this embodiment of the present invention, as shown in FIG. 1, an MIM-type thin-film capacitor in which a dielectric thin-film 3 is sandwiched between a lower electrode 2 and an upper electrode 4 formed on an insulating substrate 1, an insulation cover 5 being formed so as to cover the MIM-type thin-film capacitor 30.

A plurality of through holes are provided in correspondence to pads of a semiconductor element (bare chip) used in combination with this capacitor, there being three different kinds of through hole types, one is a lower electrode exposure through hole 6 at which only the lower electrode 2 is exposed, the second being an upper electrode exposure through hole 7 at which only the upper electrode 4 is exposed, and the third being a through hole 8 at which neither the lower electrode 2 nor the upper electrode 4 is exposed.

With the exception of the through holes 6, 7, and 8 and the locations at which the lower electrode 2 and the upper electrode 4 are exposed, a part at which the dielectric thin film 3 is sandwiched between the lower electrode 2 and the upper electrode 4 forms a thin-film capacitor 30, all of the exposed parts of each of the lower electrode 2 and the upper electrode 4 forming the connection electrodes of the thin-film capacitor 30.

In FIG. 1 and FIG. 2, either one of the lower electrode lower electrode 2 and the upper electrode 4 is used as a power supply plane, the other of the lower electrode 2 and the upper electrode 4 being used as a ground plane, the lower electrode exposure through hole 6 and the upper electrode exposure through hole 7 each being formed at a place in correspondence to that of the power supply and ground pads of a semiconductor element, respectively so as to expose each of these planes, the through holes 8 corresponding to signal pads of the semiconductor element being formed within which neither the power supply plane nor the ground plane is exposed, connection of the capacitor being made to the semiconductor element and the mounting substrates via connection electrodes (exposed parts) within the through holes 6 and 7, so that the capacitor of this embodiment functions as a decoupling capacitor.

Although there is no restriction with regard to a material of the insulation substrate 1 of the above-noted capacitor, it is preferable that an organic film or ceramic be used. Additionally, although there is no restriction on the material of the organic film, it is desirable that there be no degradation or softening thereof at temperature at which the dielectric thin film 3 is formed, and it is preferable that a polyimide with good heat resistance be used. Additionally, although there is no restriction with regard to a ceramic material, preferable materials are $Al_2O_3$ and $ZrO_2$ or the like, which enable fabrication of thin plates and having high strength and are heat-resistant material.

Although there is no restriction with regard to the lower electrode 2, it is desirable that this be a metal or an alloy making a good adhesion with the insulation substrate 1 and not exhibiting diffusion into the dielectric thin film 3, for example, laminated films one formed of an activated metal such as Ti, Cr or the like and other formed of Pt successively from the insulation substrate 1 side.

In the same manner, although there is no restriction with regard to the upper electrode 4, it is desirable that this material be not exhibiting diffusion into the dielectric thin film 3, and the use of Pt is preferable. In the lower electrode 2 and upper electrode 4, the use of a material such as Pt or the like having good barrier characteristics is used at the boundary with the dielectric thin film 3, and the formation of a low electrical resistive film of Cu or Au by plating further to the outside from the boundary with the dielectric thin film 3 is effective for using these electrodes as a power supply plane and a ground plane. For example, it is preferable to use a lower electrode 2 lamination sequence of an activated metal such as Ti or Cr or the like, a plated Cu film, and a Pt film in this sequence from the insulation substrate 1 side, and to use an upper electrode 4 lamination sequence of a Pt film and then a plated Cu film from the dielectric thin film 3 side. Although no restriction is imposed on the thickness of the plated Cu film, it is preferable that the thickness be in the range from approximately 1 $\mu$m to approximately 20 $\mu$m. Additionally, although there is no restriction placed on the method of fabricating the electrodes, it is preferable that the method be sputtering, vapor deposition, or plating, which methods enable film formation at a low temperature.

Although there is no restriction on the material of the dielectric thin film 3, it being sufficient for this to be a material with a good insulation properties, such as tantalum oxide, aluminum oxide, or silicon oxide or the like, and it is preferable that this be a chemical compound having a perovskite structure with a high dielectric constant.

Desirable chemical compounds having a perovskite structure include compound perovskite compounds with a backbone of $SrTiO_3$ $BaToO_2$ or $PbTiO_3$ the average electron valence of which having been made 2 by replacement of a part of Pb, Ba site (A site) with Sr, Ca, La or the like, or with the average electron valence having been made 4 by replacement of a part of the Ti (B site) by Mg, W, Nb, Zr, Ni, Zn or the like.

Although there is no restriction with regard to the method of fabricating the dielectric thin film 3, it is preferable that this be done by sputtering, CVD or the Sol-gel process, which enable formation of a film at a low temperature of 450° C. or lower, desirably 400° C. or lower.

Although there is no restriction with regard to the material of the insulation cover layer 5, it is possible to use a polyimide, an epoxy resin, or a silicone resin. A different material can be used, as long as it is capable of withstanding the temperatures encountered in the mounting process.

In the case of this embodiment, because one of the lower electrode 2 and upper electrode 4 is used as the power supply plane and the other is used as the ground plane, it is possible to achieve such effects as incurring no functional problem should a part of these planes be cut, as being able to achieve capacitance between the planes, and shielding of noise radiated from the semiconductor element by these planes.

Figure 3:
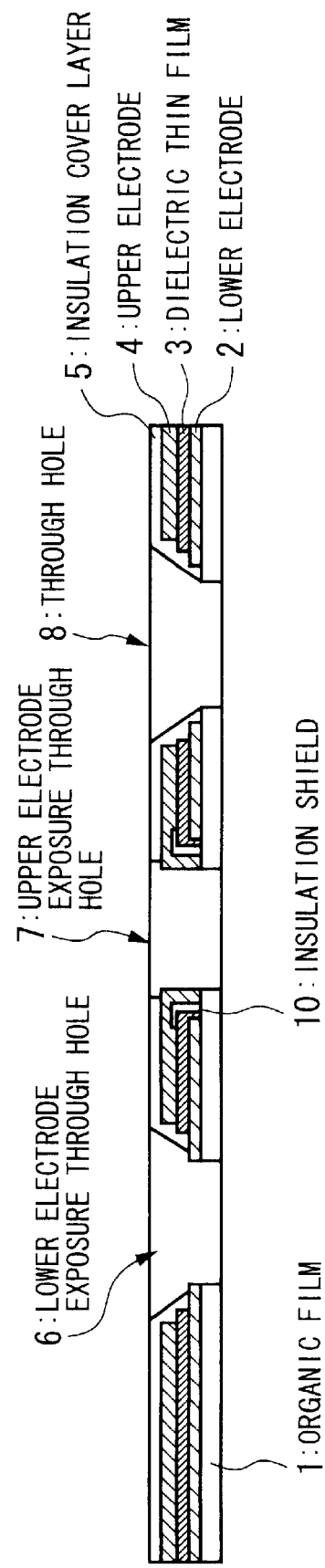
FIG. 3 is a cross-sectional view of a capacitor, illustrating an embodiment of the present invention.

A second embodiment of the present invention is a capacitor having the structure shown in FIG. 3. The basic configuration of a capacitor according to the second embodiment is the same as that of the first embodiment, but differing in only the details of the through hole part. In FIG. 3, therefore, elements in common with FIG. 1 are assigned the same reference numerals, and will not be described in detail herein.

Similar to the case of the first embodiment, a capacitor of the second embodiment of the present invention, as shown in FIG. 3, has three types of through holes, a lower electrode exposure through hole 6 at which only the lower electrode 2 is exposed, an upper electrode exposure through hole 7 at which only the upper electrode 4 is exposed, and a through hole 8 at which neither the lower electrode 2 nor the upper electrode 4 is exposed. In this embodiment, an organic film is used as the insulation substrate 1.

In the case of this embodiment, in the upper electrode exposure through hole 7, an edge of the upper electrode 4 corresponding to the inner surface of the through hole is extended downward, this being formed on the inner surface side of the through hole so as to cover an edge part of the dielectric thin film 3 and an edge part of the lower electrode 2.

Additionally, in the case of this embodiment, at the part of the upper electrode exposure through hole 7, an insulation shield 10 is provide so as to cover an edge part of the lower electrode 2 and the upper electrode 4. This insulation shield 10 is formed, for example, of an organic insulating material such as polyimide or the like, or of an inorganic insulating material such as ceramic or glass.

In the configuration of this embodiment, in the case of forming the dielectric thin film 3 using sputtering, the covering ratio with respect to the vertical surface of the electrode edge of the dielectric thin film 3 is generally smaller than the covering ratio with respect to another flat surface. Therefore, as shown in FIG. 3, the provision of the insulation shield 10 is effective in preventing a short of the upper electrode 4 and the lower electrode 2. Thus, in the case of using this structure, it is possible to select sputtering as a method of forming the dielectric thin film 3. It is also possible by forming the insulation shield 10 to reduce shorting failures of the upper electrode 4 and the lower electrode 2.

The insulation shield 10 formed so as to facially abut the upper electrode exposure through hole 7 can be formed so as to cover a vertical surface of an edge part of the lower electrode 2 under the dielectric thin film 3, rather than a vertical surface of the electrode edge of the dielectric thin film 3 shown in FIG. 3, and then over which is formed the dielectric thin film 3, thereby achieving the same type of effect.

Figure 4:
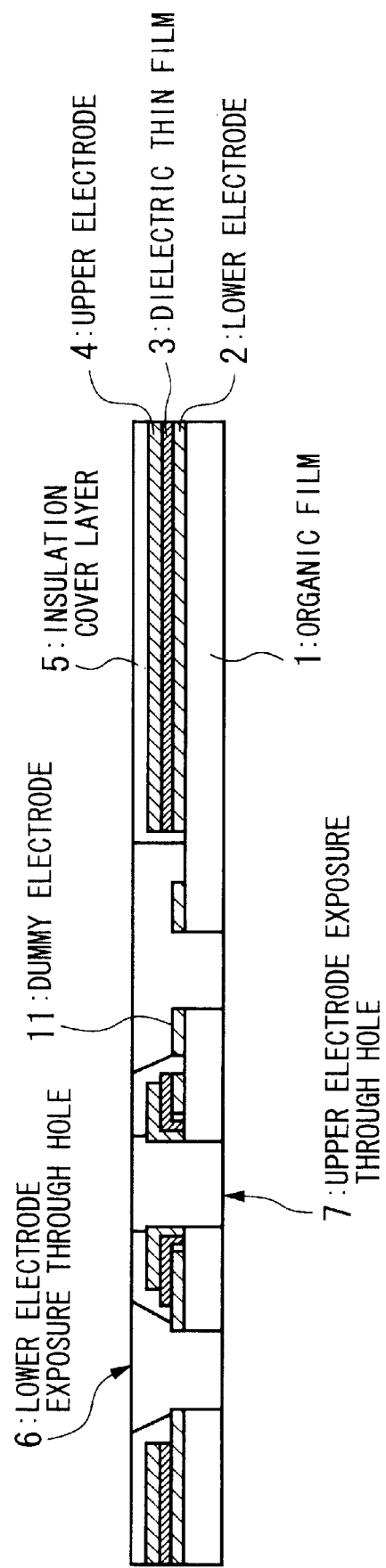
FIG. 4 is a cross-sectional view of a capacitor, illustrating an embodiment of the present invention.

A third embodiment of the present invention is described below, with reference to FIG. 4, which shows a cross-sectional view of a capacitor according to this third embodiment. The basic configuration of a capacitor according to the third embodiment is the same as that of the first embodiment, the difference therebetween being the detailed constructions of the through hole part. In FIG. 4, therefore, elements corresponding to elements in FIG. 1 are assigned the same reference numerals and are not described in detail herein.

Similar to the case of the first embodiment, in this embodiment, as shown in FIG. 4, has three types of through holes, a lower electrode exposure through hole 6 at which only the lower electrode 2 is exposed, an upper electrode exposure through hole 7 at which only the upper electrode 4 is exposed, and a through hole 8 at which neither the lower electrode 2 nor the upper electrode 4 is exposed. In this embodiment, an organic film is used as the insulation substrate 1.

As shown in FIG. 4, at a through hole at which neither the lower electrode 2 nor the upper electrode 4 is exposed, the insulation substrate 1 extends outward toward the inside of the through hole 8, and a dummy electrode 11 is formed over the upper surface thereof. This dummy electrode 11 is an independent pattern element not electrically connected to either the lower electrode 2 or the upper electrode 4. The dummy electrode 11 can be formed of an arbitrary material, and if this is formed of the same material as the lower electrode 2 or the upper electrode 4, the formation thereof does not complicate the manufacturing process.

By providing the dummy electrode 11 at the edge of a through hole 8 at which neither the lower electrode 2 nor the upper electrode 4 is exposed, there is a joining, not only of the lower electrode exposure through hole 6 and upper electrode exposure through hole 7, but between the dummy electrode 11 and a signal pad of a semiconductor element at the through hole 8 part as well, this being advantageous in terms of achieving uniformity of joining between the capacitor and the semiconductor element. That is, the dummy electrode 11 is provided in correspondence with a pad that does not correspond to a power supply pad or a ground pad of the semiconductor element.

Figure 5:
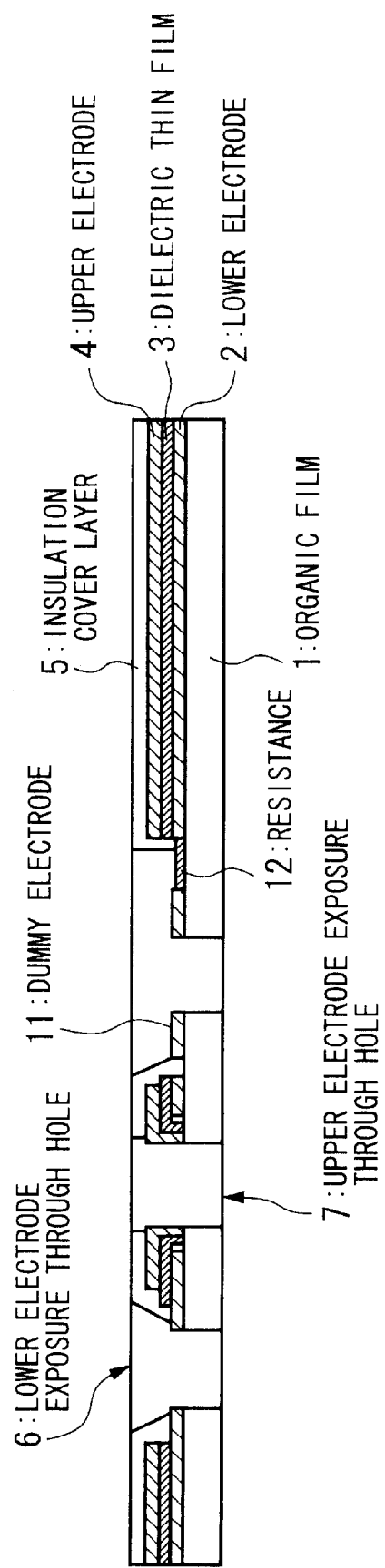
FIG. 5 is a cross-sectional view of a capacitor, illustrating an embodiment of the present invention.

A fourth embodiment of the semiconductor element is shown in FIG. 5, which is a cross-sectional view of a capacitor according to this embodiment. The basic configuration of the fourth embodiment is the same as that of the first embodiment, the difference being with respect to the detailed constructions of the through hole part. In FIG. 5, therefore, elements corresponding to elements in FIG. 1 are assigned the same reference numerals, and are not described in detail herein.

Similar to the case of a capacitor according to the first embodiment, this embodiment as illustrated in FIG. 5, has three types of through holes, a lower electrode exposure through hole 6 at which only the lower electrode 2 is exposed, an upper electrode exposure through hole 7 at which only the upper electrode 4 is exposed, and a through hole 8 at which neither the lower electrode 2 nor the upper electrode 4 is exposed. In this embodiment, an organic film is used as the insulation substrate 1.

In the case of this fourth embodiment, as shown in FIG. 5, an internal dummy electrode 11 in a through hole 8 at which neither the lower electrode 2 nor the upper electrode 4 each being corresponding to a signal pad of a semiconductor element, is exposed, is connected to the lower electrode 2 or the upper electrode 4 via a resistor 12 (illustrated as a connection to the lower electrode 2 in FIG. 5). Therefore, a portion between a signal pad and a ground pad of the semiconductor element or between a signal pad and power supply pad is connected to each other via the resistor 12. When this is done, by causing the resistance value to match the characteristic impedance of the circuit, the resistor 12 serves as a terminating resistor.

Although there is no restriction with regard to a material and a method of fabricating the resistor, it is preferable to use a thin-film resistor that is easily amenable to downsizing, and it is preferable to use a titanium nitride, tantalum nitride, nichrome alloy, or metal silicide or the like fabricated by sputtering, CVD, or vapor deposition.

Although a terminating resistor is usually mounted to a board as a chip component, in the case of this embodiment, because the resistor 12 serves as a terminating resistor, it is not necessary to mount a chip component as a terminating resistor. As a result, there is not only a reduction in the required mounting surface area, but also elimination of a process step if mounting the terminating resistor. Because the terminating resistor can be disposed near an LSI device, there is an improvement in the termination characteristics.

Figure 6:
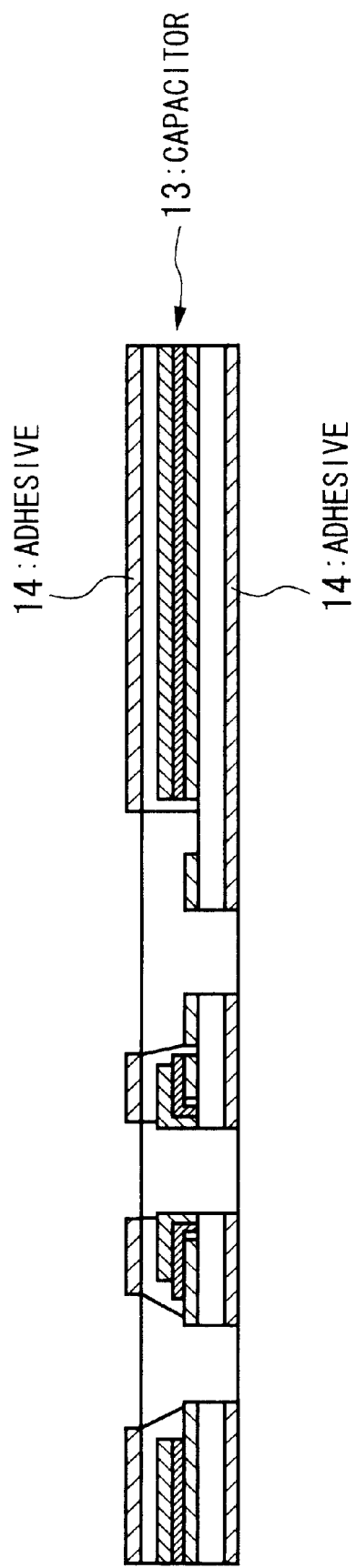
FIG. 6 is a cross-sectional view of a capacitor, illustrating an embodiment of the present invention.

A fifth embodiment of the present invention is shown in FIG. 6, which shows a capacitor according to the fifth embodiment. The basic configuration of the fourth embodiment is the same as that of the third embodiment, the difference being with respect to provision of an adhesive. In FIG. 6, therefore, elements corresponding to elements in FIG. 4 are assigned the same reference numerals, and are not described in detail herein.

Similar to the case of a capacitor according to the third embodiment, this embodiment as illustrated in FIG. 6, has three types of through holes, a lower electrode exposure through hole 6 at which only the lower electrode 2 is exposed, an upper electrode exposure through hole 7 at which only the upper electrode 4 is exposed, and a through hole 8 at which neither the lower electrode 2 nor the upper electrode 4 is exposed. Additionally, there is a dummy electrode 11 formed within a through hole 8 at which neither the lower electrode 2 nor the upper electrode 4 is exposed.

In the case of this embodiment, an adhesive 14 is applied to both surfaces of a sheet capacitor 13, that is, to the lower surface of the insulation substrate 1 made of an organic film, and to the upper surface of the insulation cover layer 5.

Although there is no restriction with regard to the material of the adhesive 14, it is preferable to use an epoxy resin or a silicone resin. The adhesive 14 (resin) applied to the upper and lower surfaces of the capacitor 13 serves to adhere a portion except for the connection pads used when it is connected to the semiconductor element or to a mounting substrate, and serves to both reinforce the electrode connection and seal the semiconductor element.

Furthermore, by applying the adhesive 14 to at least one surface of the capacitor 13, it is possible to achieve effectiveness when making connection of the capacitor to just either the semiconductor element or the mounting substrate. In this embodiment, although the example shown is that of applying an adhesive to the capacitor, this part of the embodiment can be applied as well to other embodiments described herein.

In the above description of the embodiments of the present invention, the language used describes the example of a capacitor having through holes corresponding to positions of input and output pads of a semiconductor element (bare chip), these through holes can alternatively be made to correspond to positions of input and output pads of a semiconductor package, in which case although there is no restriction with regard to the semiconductor package, one example that can be cited is that of a package that can be mounted and connected by the use of ball bumps, such as a BGA type package, and in particular a CSP.

Because a capacitor according to the above-described embodiment is intended to be mounted in a space between a semiconductor element and a mounting substrate joined to each other with a flip-chip method, or in a space between a semiconductor package and a mounting substrate connected to each other with a bump-connected form, although the plane-view dimensions thereof are not restricted, it is desirable to have the surface area thereof be equivalent to or less than that of the semiconductor element or semiconductor package, from the standpoint of reducing the mounting surface area.

Although there is no restriction with regard to the thickness thereof, because of the limitation on the size of the above-noted spaces, it is desirable that the thickness be no greater than 100 μm in the case of a semiconductor element, and no greater than 500 μm in the case of a semiconductor package.

The provision of a nickel and gold plating in this sequence from the surface of an exposed part or dummy electrode within a through hole of the capacitor prevents diffusion of the joining material into the electrode, this being effective in achieving a good connection. Although there is no restriction with regard to the thickness of each of these plating, it is preferable that these be approximately from 1 $\mu$m to 6 $\mu$m for nickel and from 0.05 $\mu$m to approximately 2 $\mu$m for gold.

Figure 7:
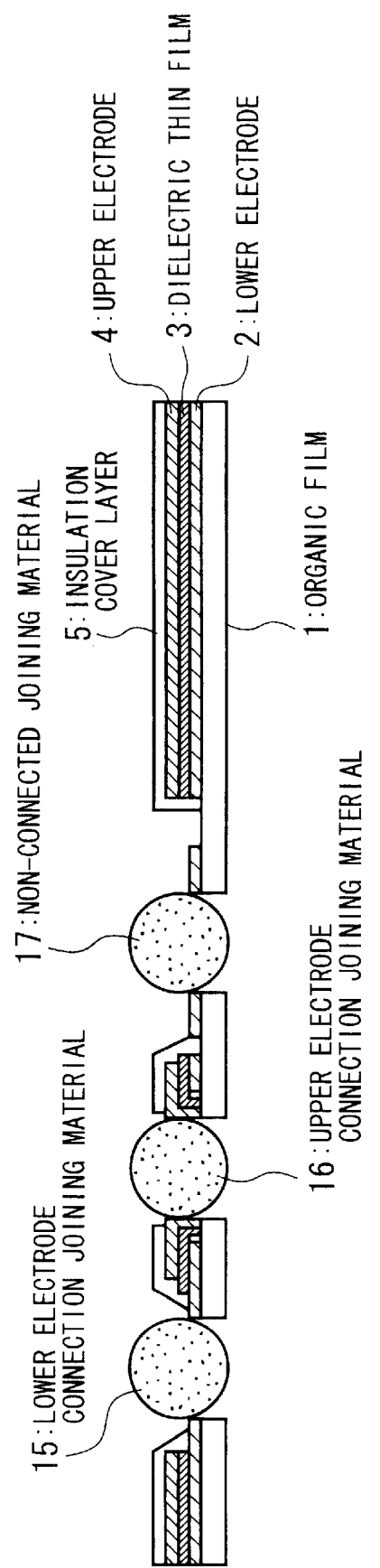
FIG. 7 is a cross-sectional view of a capacitor, illustrating an embodiment of the present invention.

A sixth embodiment of the present invention is shown in FIG. 7, which shows a capacitor according to the sixth embodiment. The basic configuration of the sixth embodiment is the same as that of the third embodiment, the difference being the provision of a joining material within a through hole. In FIG. 7, therefore, elements corresponding to elements in FIG. 4 are assigned the same reference numerals, and are not described in detail herein.

In the sixth embodiment of the present invention as illustrated in FIG. 7, which is a cross-sectional view of a capacitor according to the sixth embodiment, joining materials (or bumps) 15, 16, and 17 are disposed within the through holes 6, 7, and 8 of a capacitor 13. Of this plurality of joining materials, the joining material disposed within the lower electrode exposure through hole 6 is a lower electrode connection joining material 15 connected to the lower electrode 2, and the joining material disposed within the upper electrode exposure through hole 7 is the upper electrode connection joining material 16 connected to the upper electrode 4. At the through hole 8 at which no electrode is exposed, the non-connected joining material (or bump) 17 is fixed in place to the through hole 8 by an adhesive or the like.

Although there is no restriction with regard to a material of the upper electrode connection joining material 15, the lower electrode connection joining material 16, and the non-connected joining material 17, it is preferable to use solder, metal bumps, electrically conductive adhesive or anisotropic electrically conductive adhesive, as commonly used in a flip-chip joining process applied to a semiconductor element or a BGA joining process applied to a semiconductor package.

Additionally, although there is no restriction with regard to size, the size should be a size suitable to the pad size of the semiconductor element or semiconductor package.

By using the capacitor according to the sixth embodiment as shown in FIG. 7, it is possible to achieve a good joining operation, without the need to priory form a joining material or bump for a semiconductor element or a semiconductor package to be connected to a mounting substrate.

Because the capacitors according to the above-described first through sixth embodiments are connected in a space between a semiconductor element and a mounting substrate or connected in a space between a semiconductor package and a mounting substrate via connection pads within through holes 6 to 8 provided in the capacitor, it is possible to shorten the distance between the semiconductor element and the capacitor, thereby enabling a reduction in the wiring inductance of the capacitor. In particular, by mounting the above-noted capacitor between a semiconductor element and a mounting substrate, because the inductance caused by wiring outside of the semiconductor element is eliminated, it is possible to achieve a capacitor with superior high-frequency characteristics, thereby achieving sufficient functionality as a decoupling capacitor. Additionally, because a thin-film capacitor is used as the capacitor according to the present invention, the value of ESL (equivalent series inductance) thereof is also small.

Figure 8:
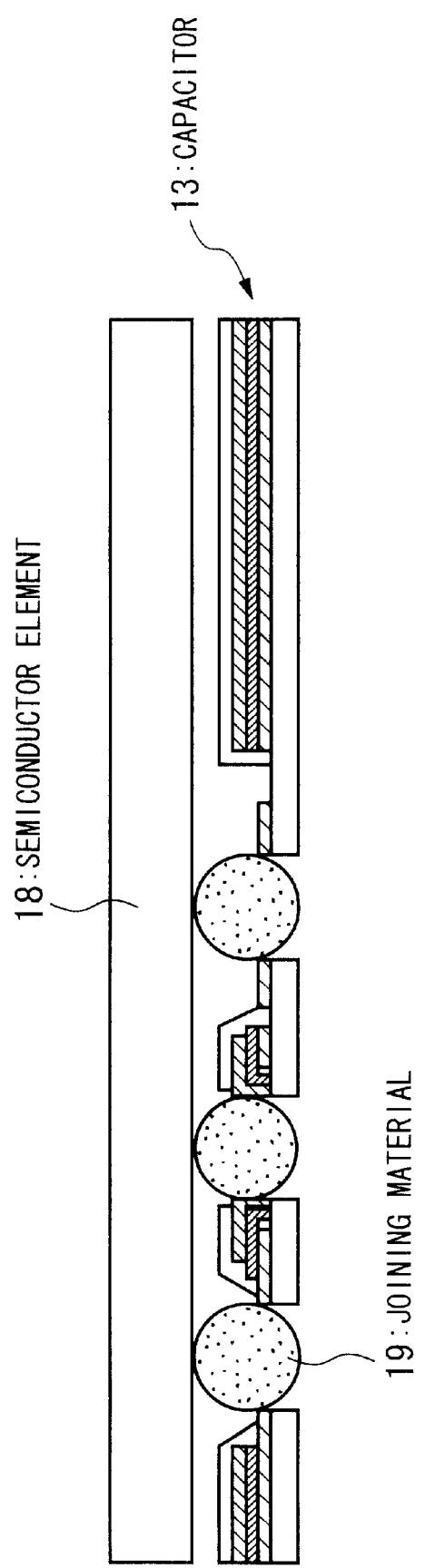
FIG. 8 is a cross-sectional structural view of a semiconductor element to which a capacitor according to an embodiment of the present invention is connected.

A seventh embodiment of the present invention is shown in FIG. 8, which shows the structure of a semiconductor device according to the present invention, which is a semiconductor device into which is built a capacitor according to the foregoing described embodiments of the present invention.

In a semiconductor device according to the present invention, as illustrated in FIG. 8, a capacitor according to the first to fifth embodiments of the present invention described above (FIG. 1 to FIG. 6) is connected to input and output pads of a semiconductor element 18 by a joining material 19 via a lower electrode 2 and an upper electrode 4 within the through holes 6 and 7 of the capacitor 13.

Alternatively, in the case of using a capacitor according to the sixth embodiment (FIG. 7), the structure is one in which the joining materials such as the lower electrode connection joining material 15, the upper electrode connection joining material 16, non-connected joining material or the like, each being priory provided in the capacitor 13 are joined to the semiconductor element 18. There is no restriction placed on the type and size of the semiconductor element 18. With regard to the size and material of the joining material 19 and the capacitor 13 as well, similar to the case of the capacitor sheets described with reference to FIG. 1 to FIG. 7, there are no restrictions. The provision of a semiconductor device to which a capacitor of FIG. 8 is connected is the same as providing a chip to which a decoupling capacitor is already connected, and enables the provision of a semiconductor device having a small voltage drop caused by a change in the load.

Figure 9:
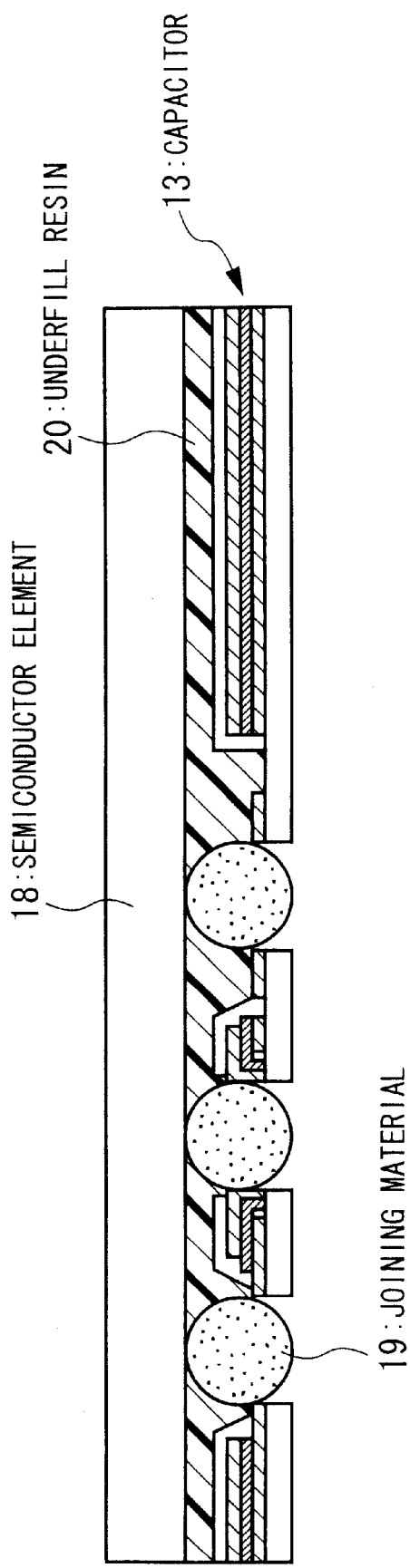
FIG. 9 is a cross-sectional structural view of a semiconductor element to which a capacitor according to an embodiment of the present invention is connected.
Figure 10:
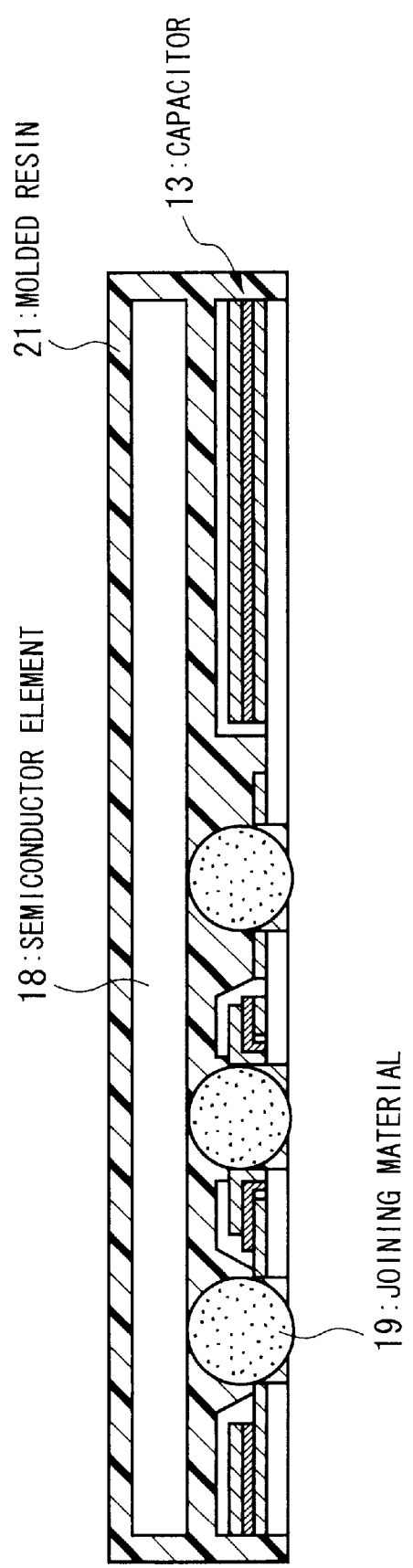
FIG. 10 is a cross-sectional structural view of a package having a built-in capacitor according to an embodiment of the present invention.

By providing an underfill resin 20 shown in FIG. 9 or a molded resin 21 shown in FIG. 10 to a semiconductor device, it is possible to seal the semiconductor element 18. With regard to the underfill resin 20 and the molded resin 21 as well, there are no restrictions with regard to material. By providing the molding as shown in FIG. 10, it is possible to provide a semiconductor package with a built-in capacitor. Additionally, if the size of the capacitor sheet of FIG. 10 and that of the molded resin are made equivalent, it is possible to provide a CSP with a built-in capacitor.

In any semiconductor device (including a semiconductor package and a CSP) to which a capacitor described with reference to FIG. 8 to FIG. 10 is connected, a capacitor is connected directly to input and output pads of a semiconductor element 18, the wiring inductance outside the semiconductor element 18 is eliminated, thereby enabling the achievement of a capacitor with good high-frequency characteristics. Because the capacitor used in this case is a capacitor according to the present invention described above with reference to FIG. 1 to FIG. 7, as described above the value of ESL is small, thereby providing good high-frequency characteristics.

Figure 11:
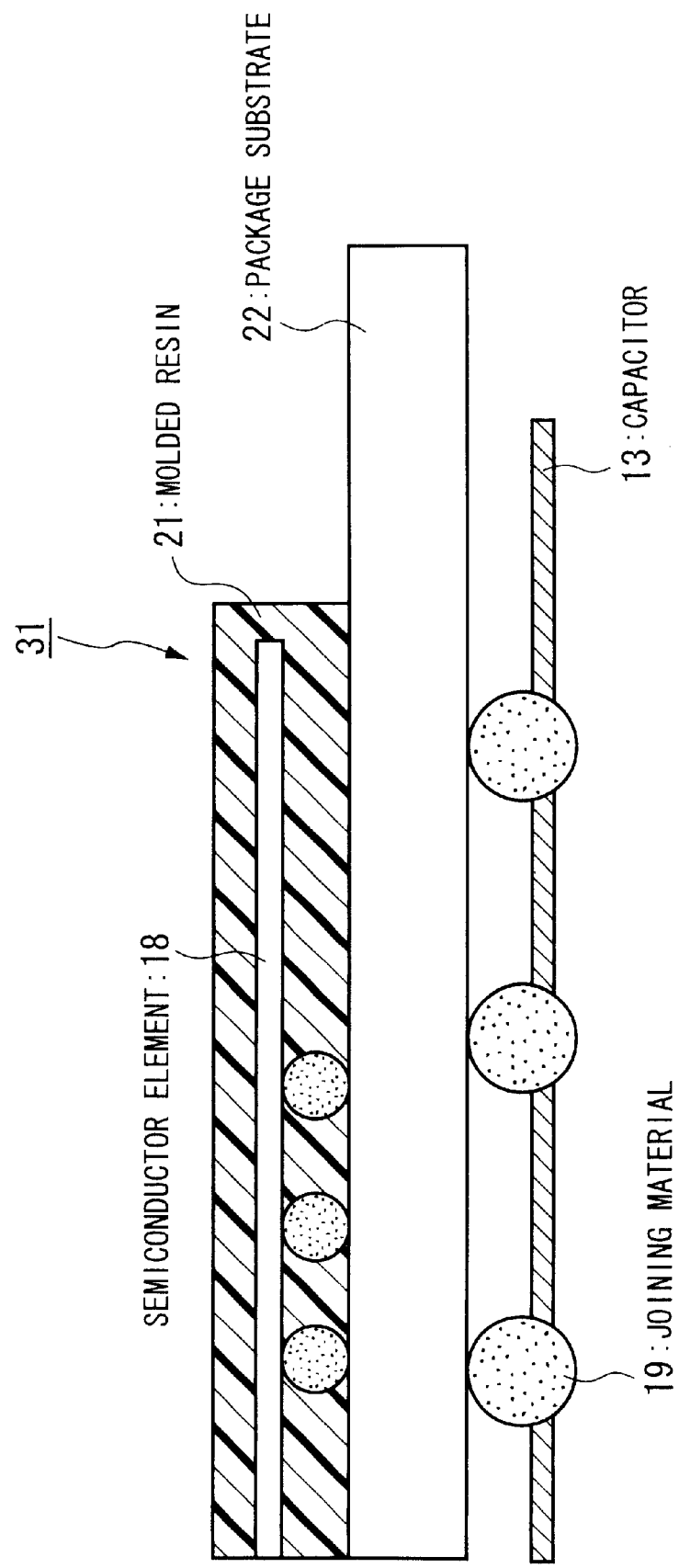
FIG. 11 is a cross-sectional structural view of a package having a built-in capacitor according to an embodiment of the present invention.

An eighth embodiment of the present invention is described below with reference made to FIG. 11, a structural cross-sectional view showing the structure of a semiconductor device into which is built a capacitor according to the foregoing described embodiments. In FIG. 11, the electrode configuration within the capacitor is not shown.

A semiconductor device according to this embodiment, as shown in FIG. 8, has a semiconductor package 31, in which a semiconductor element 18 is joined onto a package substrate 22, with sealing therefor provided by a molded resin 21. A capacitor 13 having throughholes suited for the input and output terminals of the semiconductor package 31 is connected to the input and output terminals of the semiconductor package 31 by a joining material 19 via electrodes within the through holes of the capacitor 13. There is no restricted placed on the type and size of the semiconductor package 31 shown in FIG. 11. With regard to the size and material of the joining material 19 as well as of the capacitor 13, there are no restrictions, similar to the case of the capacitor sheets described with reference to FIG. 1 to FIG. 7. However, the use of solder balls for the joining material 19 connected to the capacitor 13, it is effective in enabling the use of BGA terminals of a semiconductor package 31. If this structure is adopted, it is possible to provide a semiconductor package 31 that is connected to a capacitor.

In the case in which the semiconductor package 31 of FIG. 11 is a CSP to which a capacitor is connected, it is possible to provide a CSP that is connected to a capacitor. Using these semiconductor packages to which are connected capacitors, compared to the semiconductor device described with reference made to FIG. 8 to FIG. 10, the distance between the semiconductor element 18 and the capacitor 13 is lengthened, but in comparison with the case of mounting a chip capacitor component on a mounting substrate as done in the past, it is possible to shorten the distance between the semiconductor element 18 and the capacitor, thereby enabling a reduction in the surface area used on the mounting substrate. It is additionally possible to loosen the restrictions on the precision of manufacturing the capacitor when mounting in accordance to this embodiment, thereby providing an expected improvement in manufacturing yield. Additionally, there is the advantage of being able to use a packaged semiconductor element with assured operation.

Figure 12:
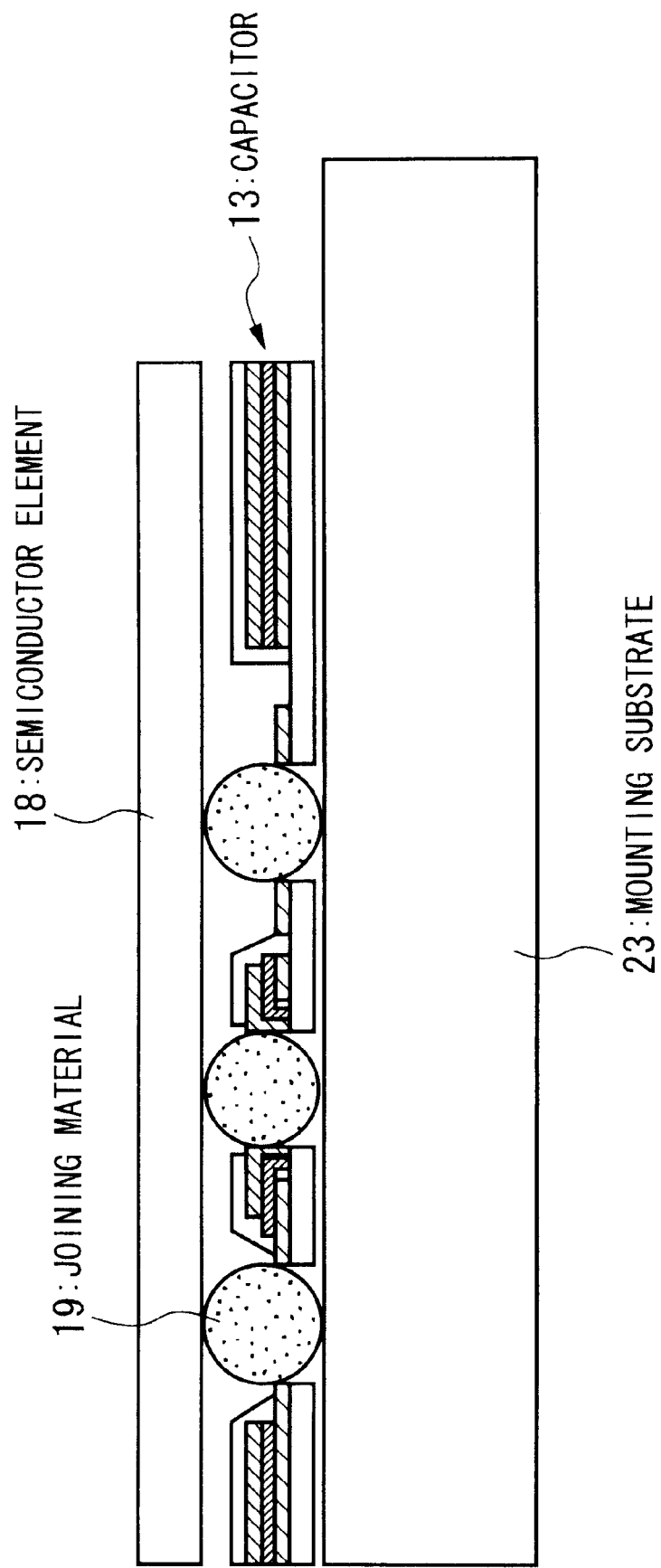
FIG. 12 is a cross-sectional view of a capacitor mounting structure according to an embodiment of the present invention.

A ninth embodiment of the present invention is a mounting structure for a capacitor, this being shown in the cross-sectional view of FIG. 12.

A capacitor 13 described with references made to FIG. 1 to FIG. 7 is interposed between a flip-chip connected semiconductor element 18 and a mounting substrate 23, and is connected to both the semiconductor element 18 and the mounting substrate 23 by a joining material 19 via electrodes within through holes provided in the capacitor 13. In this structure, there is no restriction placed on the material or type of semiconductor element, joining material, and mounting substrate. By achieving this mounting structure, the distance between the capacitor 13 and the semiconductor element 18 is shortened, and there is no wiring inductance outside of the semiconductor element 18, thereby providing a capacitor functioning with superior high-frequency characteristics.

Additionally, because the capacitor used in this case is a thin-film capacitor having a small value of ESL when used as a component, if a dielectric having a high dielectric constant is used as a constituent element thereof, it is possible to achieve a compact module having a decoupling capacitor with the structure of FIG. 12, without the need to connect a large number of capacitors in parallel as in the past. Additionally, because the capacitor is mounted in a space of a mounting substrate which in the past was devoted only to connection of the semiconductor element 18, it is possible to reduce the surface area used to mount the capacitor onto a mounting substrate.

Figure 13:
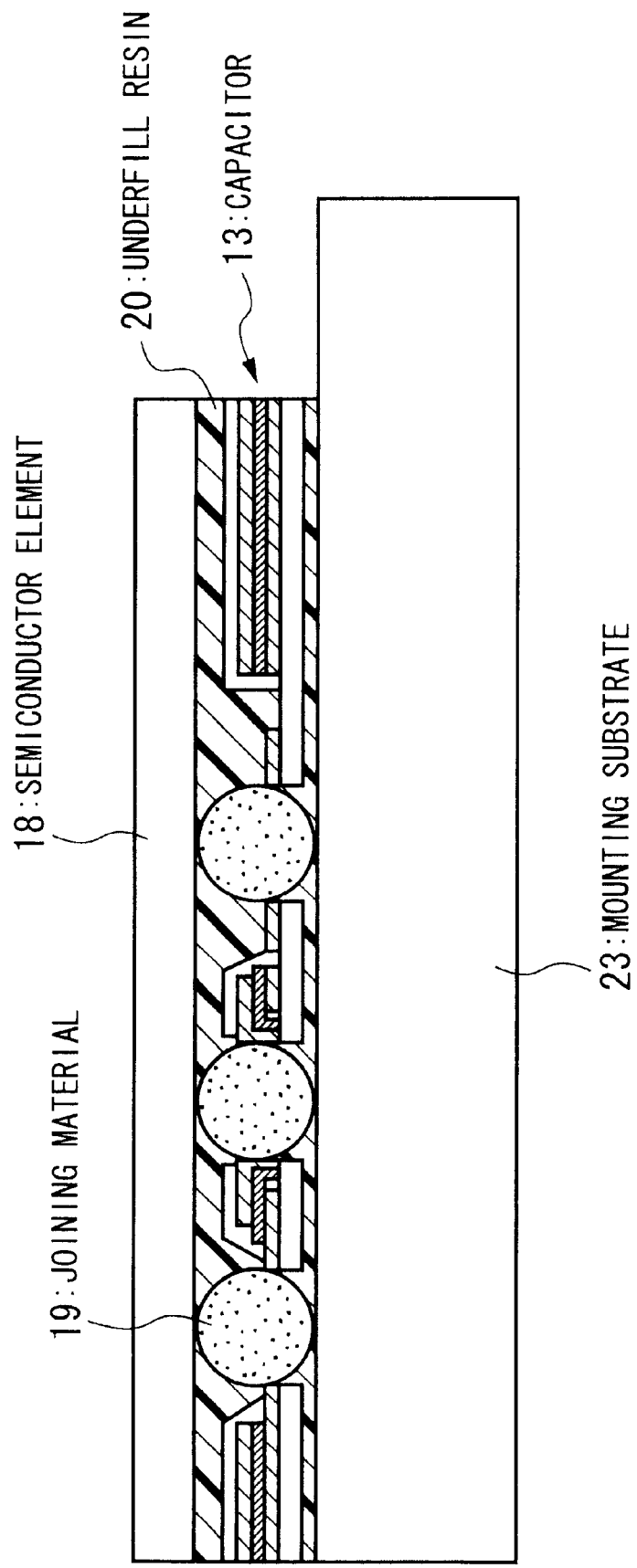
FIG. 13 is a cross-sectional view of a capacitor mounting structure according to an embodiment of the present invention.

As shown in FIG. 13, the introduction of an underfill resin 20 into the space between the semiconductor element 18 and the capacitor 13 or into the space between the capacitor 13 and the mounting substrate 23, it is possible to effectively improve the mounting reliability of the capacitor.

Figure 14:
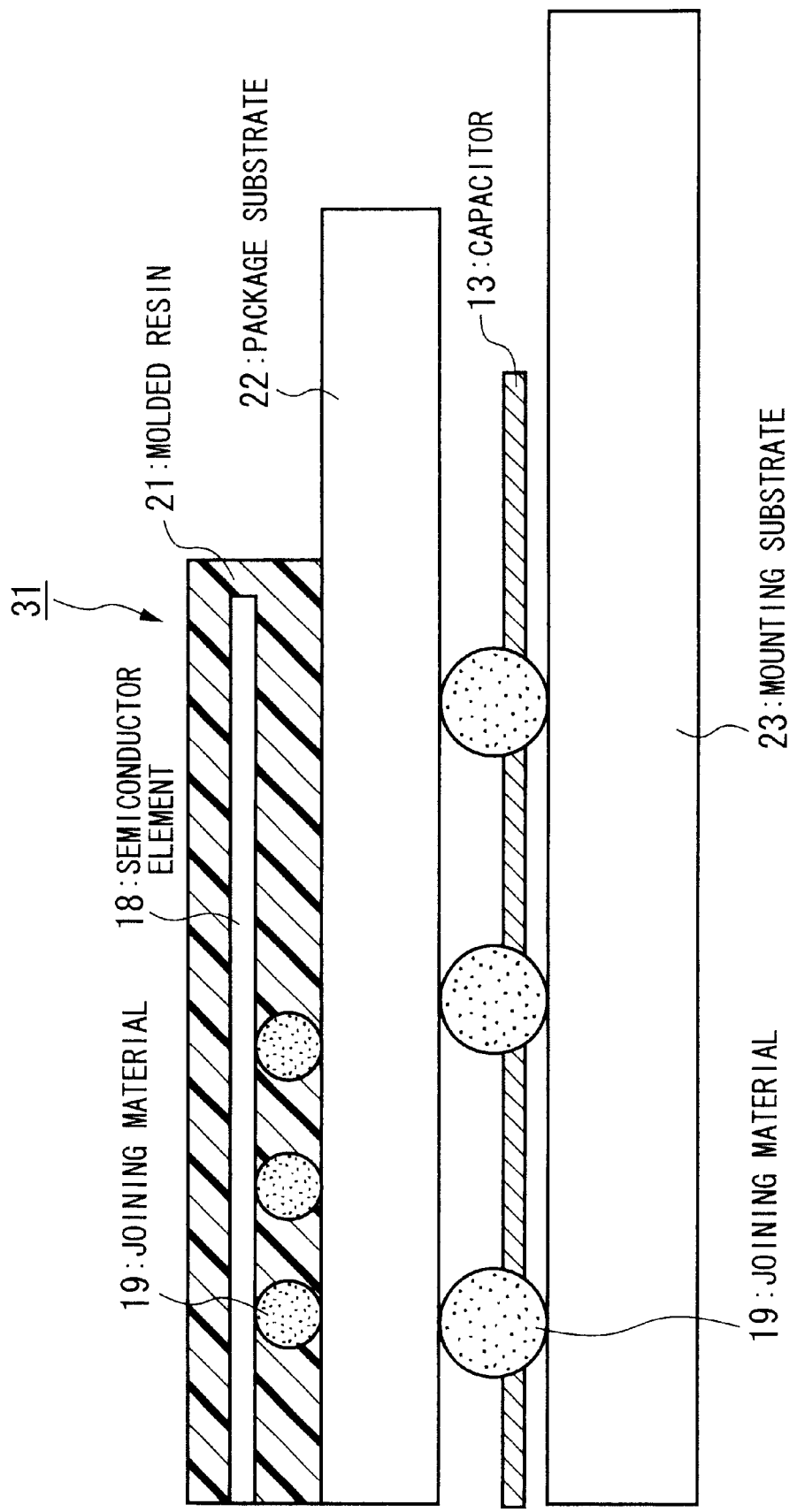
FIG. 14 is a cross-sectional view of a capacitor mounting structure according to an embodiment of the present invention.

A tenth embodiment of the present invention, which is a capacitor mounting structure, is shown in the cross-sectional view of FIG. 14.

In a mounting structure according to this embodiment of the present invention, as shown in FIG. 14, a capacitor as described with reference to FIG. 1 to FIG. 7 is interposed between a BGA-connected semiconductor package 31 and a mounting substrate 23, and is connected to both the semiconductor package 31 and the mounting substrate 23 by a joining material 19, via electrodes within through holes provided in the capacitor 13.

In the mounting structure according to this embodiment, although compared with the mounting structure of FIG. 12 and FIG. 13, the distance between the semiconductor element 18 and the capacitor 13 is increased, compared with the case of using a chip capacitor component being connected to a mounting substrate as was done in the past, it is possible to shorten the distance between the semiconductor element and the capacitor, thereby reducing the surface area on the mounting substrate. It is additionally possible to loosen the restrictions on the manufacturing precision of the capacitor, thereby bringing about an expected improvement in manufacturing yield and connecting yield. Additionally, there is the advantage of being able to use a packaged semiconductor element with assured operation. As a result, the manufacturing yield of the overall package is improved, and it is possible to manufacture a module with a decoupling capacitor, having high-frequency characteristics superior to the characteristics possible in the past.

By using solder, metal bumps, an electrically conductive adhesive, or an anisotropic electrically conductive adhesive as the joining material 19 for making connection to the mounting substrate 23 described with reference to FIG. 12 to FIG. 14, it is possible to achieve a connection to the mounting substrate by using either a flip-chip connection or BGA connection technology. In FIG. 12 to FIG. 14, by using a capacitor to which an adhesive is applied to both surfaces as shown in FIG. 6, a mounting structure is achieved in which the adhesive 14 also serves underfilling or sealing, thereby enabling an improvement of the reliability of the mounting structure.

Figure 15:
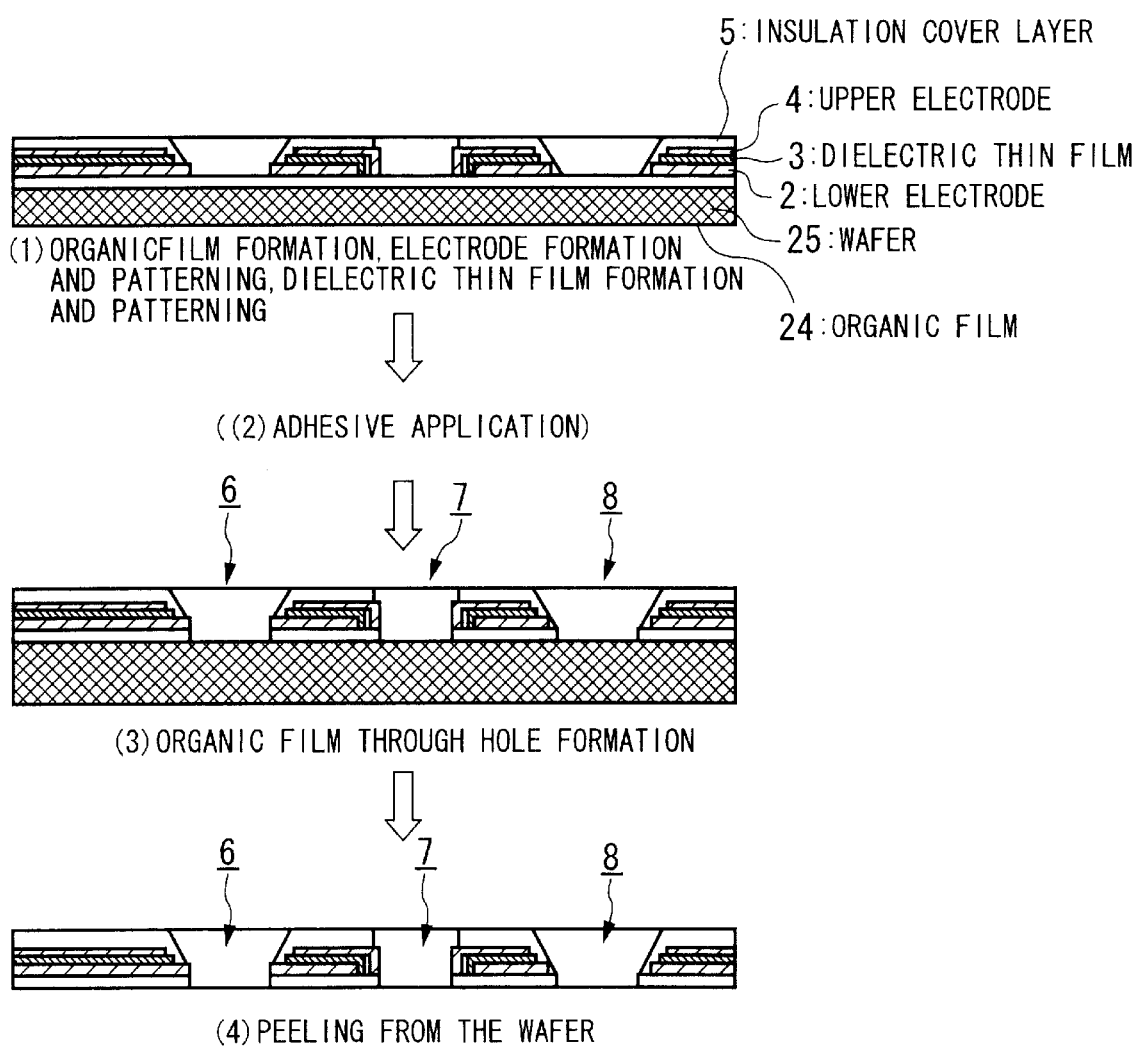
FIG. 15 is a cross-sectional view of a capacitor mounting structure according to an embodiment of the present invention.

An eleventh embodiment of the present invention is a method for manufacturing a capacitor, as shown in FIG. 15, which is a process diagram illustrating the manufacturing processes for this embodiment.

The first process step is that of forming an organic film 1 on a wafer 25, after which the lower electrode 2 film is formed and patterned, followed by the forming and patterning of the dielectric thin film 3, the forming and patterning of the upper electrode 4, and the forming of the insulation cover layer 5, in this sequence, this resulting in a completion of the main part of a capacitor having the organic film 1 as a base provided on a surface of the wafer 25. In this process, it is further possible to add providing an insulation shield 10 as described with reference to FIG. 3 after forming and patterning the dielectric thin film 3. Additionally, it is possible to simultaneously provide a dummy electrode 11 at the time of patterning of the lower electrode 2 in the case in which a dummy electrode 11 such as described with reference to FIG. 4 is provided.

The material of the wafer 25 is not restricted, it being possible to use for this wafer a silicon wafer, a glass wafer, a sapphire wafer, or another crystalline wafer or ceramic wafer having a smooth flat surface. Although there is no restriction with regard to the method of forming the organic film 1, it is preferable that this be formed by application and curing a varnish made of precursor of a polymer.

Although there is no restriction with regard to the material of the organic film 1, it is desirable that this be a high heat-resistance material, such as a polyimide or the like, and further desirable that this be a material to which impurities such as a coupling agent or the like are not added. With regard to the materials of each one of the lower electrode 2, the upper electrode 4, and the dielectric thin film 3, this embodiment is the same as described with regard to the first embodiment. Although there is no restriction with regard to the material and method of fabrication of the insulation shield 10, it is preferable that the film be formed and patterned by application of photosensitive resin, exposure and development thereof, and curing thereof, for example, using a photosensitive polyimide. Although there is no restriction with regard to the material of the insulation cover layer 5, it is preferable that this be polyimide. It is additionally possible to perform patterning of the insulation cover layer 5 such as shown in FIG. 15.

The second process step is one of applying an adhesive to a surface of the above-noted insulation cover layer 5, and while this step is not absolutely necessary, it is necessary in the case in which the adhesive is to be applied to only the upper side of the capacitor 13 as shown in FIG. 6. Although there is no restriction with regard to the material and method of application of the adhesive, it is possible to use a photosensitive adhesive to perform patterning after forming the film.

The third process step is one of forming the through holes 6, 7, and 8 in the organic film 1, and although there is no restriction with regard to the method used, in the case in which a polyimide is used as the organic film 1, it is possible to use a third-harmonic YAG laser to achieve good through hole precision. Even in the case in which the insulation cover layer 5 or adhesive 14 are not patterned, it is possible to form through holes in the insulation cover layer 5 and adhesive 14 at the same time as forming the through holes in the organic film 1.

The fourth process step is peeling the boundary between the wafer 25 and the organic film 1, so as to extract the capacitor according to the present invention. There is no restriction with regard to number of capacitors 13 on the wafer 25, and it is possible to obtain a large number of capacitors from a single wafer. Although there is no restriction with regard to the peeling method, by using a wafer 25 having a smooth flat surface, and appropriately controlling the condition of the adhesion between the organic film 1 and the wafer 25, it is possible to slice the periphery of the capacitor using a knife or laser and peel from the edge thereof, it is possible to extract the capacitor 13.

By adopting the method of manufacturing a capacitor according to this embodiment, it is possible to pattern the lower electrode 2, the dielectric thin film 3, or the upper electrode 4 as well as the insulation cover layer 5, with the flexible organic film 1 being fixed to the wafer 25, thereby enabling manufacturing of a capacitor having a micropattern.

Figure 16:
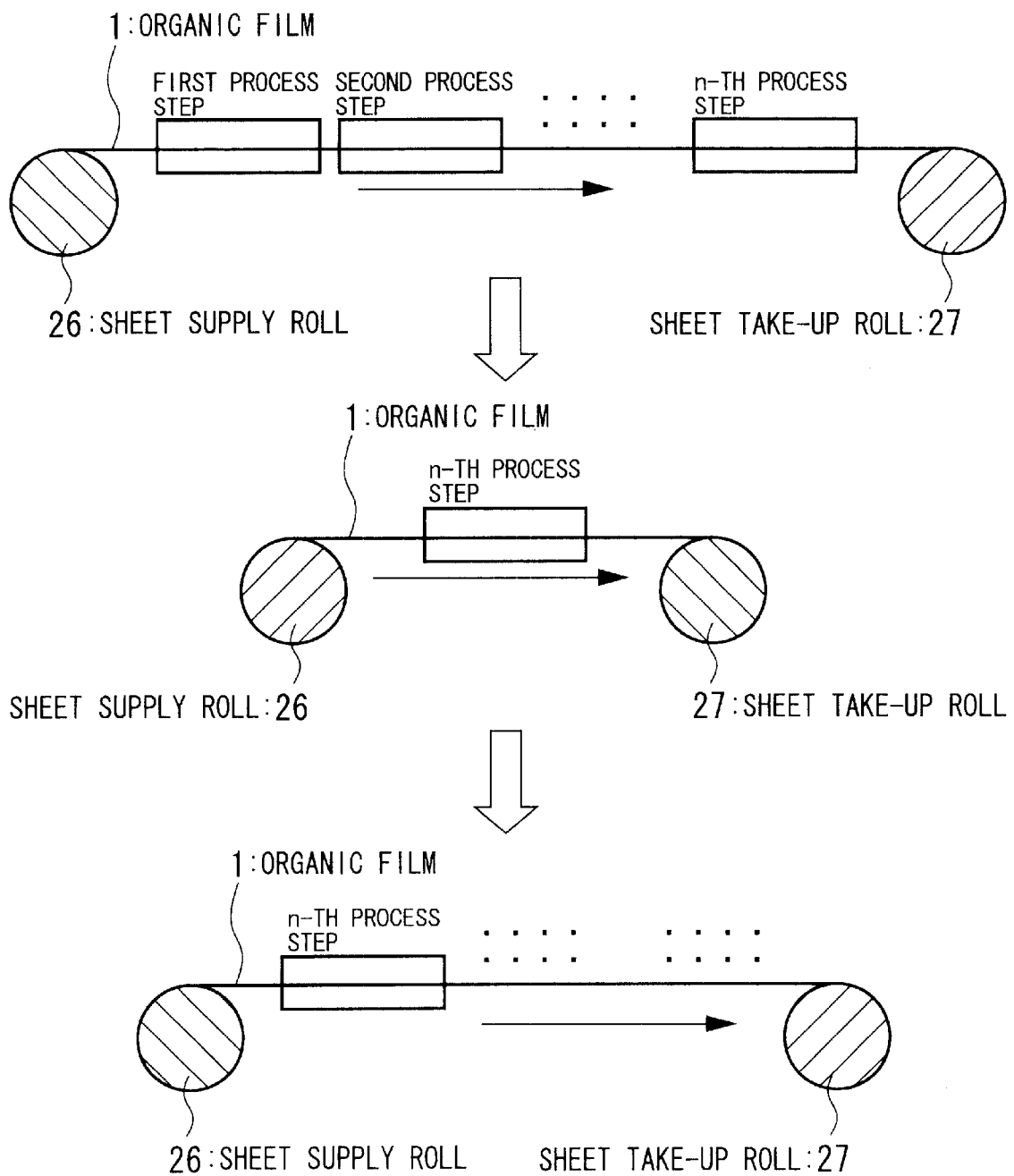
FIG. 16 is a cross-sectional view of a capacitor mounting structure according to an embodiment of the present invention.

A twelfth embodiment of the present invention is another method for manufacturing a capacitor according to the present invention, this being shown in the process diagram of FIG. 16.

A method for manufacturing a capacitor according to the present invention is a roll-to-roll process, in which an organic film is moved from a sheet supply roll to a sheet take-up roll and, as shown in FIG. 16, one in which at least the electrode film formation, electrode patterning, dielectric film formation and dielectric film patterning steps are performed on the organic film as the organic film 1 is transferred from the sheet supply roll 26 to a sheet take-up roll 27.

By means of this process step, productivity is increased and it is possible to manufacture a low-cost capacitor according to the present invention.

More specifically, sputtering is the preferred method for forming an electrode film, and by moving the organic film 1 in a sputtering chamber, a formation of the electrode film on the organic film 1 rolled around the roll is completed. It is preferable to use photoresist in electrode patterning, and the photoresist coating, baking, exposure, and development process steps can also be performed continuously between the two rolls.

Preferable coating apparatuses for coating the photoresist include a knife coater, gravure coater, rip coater, and a reverse coater. Baking is performed by causing passage through a heater zone provided between the rolls. Exposure and developing are performed by causing passage through an exposure apparatus and a developing apparatus, respectively. Electrode etching is done either by causing passage through the chamber of a dry etching apparatus such as an ion beam etching apparatus, or by causing passage through a wet etching apparatus. The difference in movement speed of the organic film 1 between the various process steps is adjusted for by automatic computer control of the running and stopping of the various process steps, transfer of the organic film 1 to the sheet take-up roll 27 and return of the organic film 1 to the sheet supply roll 26. Dielectric film formation and dielectric film patterning are performed by a process similar to that of forming and patterning the electrodes.

As shown in FIG. 16, after a part of the process steps (for example step n to step n−1) is completed in roll-to-roll mode, it is possible to transfer the organic film 1 that had been transferred to the sheet take-up roll 27 to the next process steps (for example the process steps n and n+1) as sheet supply for those process steps. From the standpoint of simplification of the apparatus, it is desirable to complete the process steps performed in a vacuum apparatus alone in the roll-to-roll mode.

Although there is no restriction with regard to the organic film 1 used in the above-noted processes, it is necessary that this be a material capable of withstanding the temperatures in the process step of forming the dielectric thin film 3, and preferable that this be an organic material such as polyimide, which has a high resistance to heat. There is no restriction on the number of process steps performed between the two rolls, and it is also possible to add, for example, forming a through hole. By adding a process step of applying an adhesive, it is possible to easily obtain a capacitor to which adhesive has already been applied.

In a method for manufacturing according to this embodiment, because it is possible to process both surfaces of the organic film 1, it is possible to manufacture a structure in which adhesive has been applied to both surfaces of the capacitor 13 shown in FIG. 6.

Additionally, by adding to the process steps between the two rolls connecting a semiconductor element, and it is possible to obtain a semiconductor element having a structure in which a capacitor is connected, and further possible by adding filling with an underfill resin or molding to obtain a package with a built-in capacitor therewithin. In the case in which the capacitor size is approximately equal to that of the semiconductor element, it is possible to obtain a CSP with a built-in capacitor therewithin.

Figure 17:
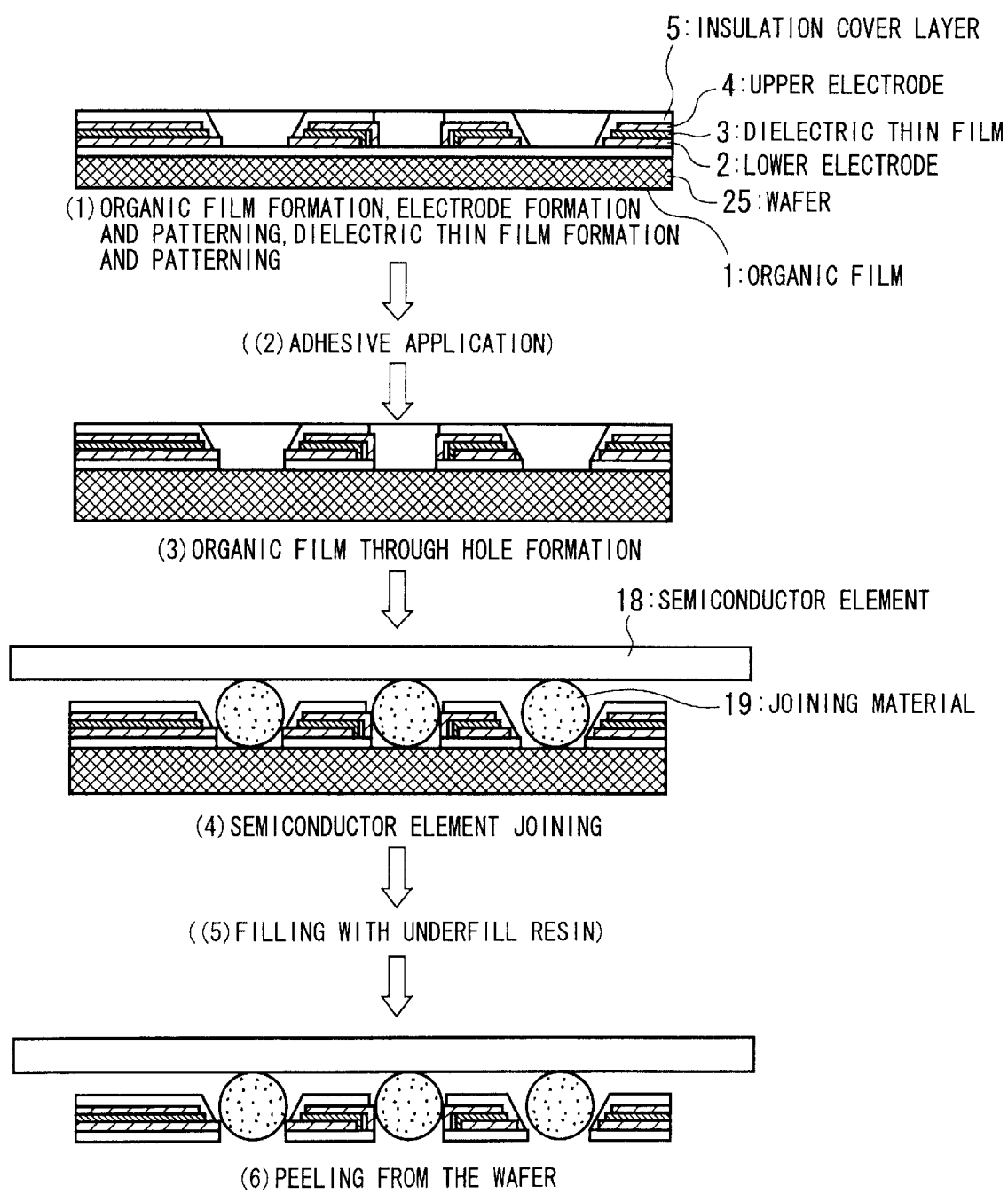
FIG. 17 is a cross-sectional view of a capacitor mounting structure according to an embodiment of the present invention.

A thirteenth embodiment of the present invention is a method for manufacturing a semiconductor device to which a capacitor according to the present invention is connected, this being shown in FIG. 17, which is a process diagram for this manufacturing method.

After performing process steps similar to those described with regard to the eleventh embodiment, up to the step at which the through holes are formed, a priory prepared semiconductor element 18 is connected to the upper electrode 4, the lower electrode 2, or a dummy electrode by a joining material 19. The joining material 19 can be a joining material that is previously supplied to the semiconductor element 18, and after through hole formation, a step can be added that distributes the joining material 19 to the through holes. If such as step that distributes the joining material is added, the formation of a joining material on the semiconductor element 18 becomes unnecessary, and it is possible to perform continuous formation of the joining material, and connection of the semiconductor element and the capacitor.

The next process step, performed if necessary, is an underfill resin-filling step. Next, by peeling the fabricated sheet from the wafer 25 with the semiconductor element 18 in the joined condition, it is possible to obtain a semiconductor device to which a capacitor is connected. In the case in which an underfill resin filling or molding step is added, at the point at which the fabricated sheet is peeled from the wafer 25, it is possible to form a semiconductor package 31 with a builtin capacitor therewithin. If the size of the capacitor is approximately equivalent to that of the semiconductor element 18, it is possible to achieve a CSP with a built-in capacitor therewithin.

In a capacitor according to the present invention as shown in FIG. 1 to FIG. 7, size and pitch of the joining pads are small compared to the size and pitch of the input and output pads of the semiconductor element, making the positioning difficult when joining to the semiconductor element. In the case in which an organic film is selected as the insulation substrate of a capacitor as shown in FIG. 1 to FIG. 7, the flexibility thereof makes positioning difficult when joining to a semiconductor element. However, by using a method for manufacturing according to the above-described embodiments, it is easily possible to achieve a structure in which a capacitor according to the foregoing embodiments is connected, as well as a semiconductor package with a built-in capacitor or a CSP with a builtin capacitor.

Performing the process steps shown in FIG. 17, a capacitor according to the present invention and a semiconductor device to which a capacitor is connected were manufactured. A polyimide varnish was spin-coated onto a 4-inch wafer and cured in a nitrogen atmosphere for 2 hours at 450° C. The polyimide varnish used was a non-photosensitive type, with a high resistance to heat, and no added coupling agent. After curing, the film thickness of the organic film was 20 $\mu$m.

Next, a lower electrode was formed by performing DC magnetron sputtering of Ti and then Pt from the polyimide side. The thickness of Ti and Pt were made 50 nm and 500 nm respectively. Using a photoresist mask for photolithography patterning, argon ion beam etching was done to pattern a lower electrode 2. After patterning, the photoresist was removed by an oxygen plasma asher.

Next, SrTiO$_3$ was sputtered with a RF supputering apparatus as a dielectric thin film to a thickness of 300 nm at a temperature of 320° C. Using patterned photoresist as a mask, etching was then done of the dielectric thin film using a mixed solution of hydrofluoric acid and nitric acid, and patterning was performed. Next, a photosensitive polyimide was applied by spin-coating to form an insulation shield, and patterned by exposure and developing, after which curing was done in a nitrogen atmosphere for 2 hours at 320° C. The thickness of the insulation shield was 1.5 $\mu$m after curing.

Next, DC magnetron sputtering was performed to form a Pt film having a thickness of 200 nm as an upper electrode 4. In the same manner as for the lower electrode, photoresist was applied and ion beam etching was performed to effect patterning.

Next, using a photosensitive polyimide as an insulation cover, patterning was performed in the same manner as for the insulation shield. Next, using a third-harmonic YAG laser, through holes were formed in the organic film, thereby completing the fabrication of the capacitor according to the present invention.

Next, by flip-chip bonding of a semiconductor element measuring 18 mm on a side priory supplied with solder balls as the joining material, with positioning, loading and heating performed, so as to make connections o the upper electrode and lower electrode of the capacitor structure. Next, underfill resin is injected into the space between the semiconductor element and the capacitor structure part, and curing thereof was performed at 150° C.

Next, the joining of the joined aggregate of the semiconductor element and the capacitor is peeled from the silicon wafer, thereby obtaining a semiconductor device to which a capacitor as shown in FIG. 9 is connected.

Figure 19:
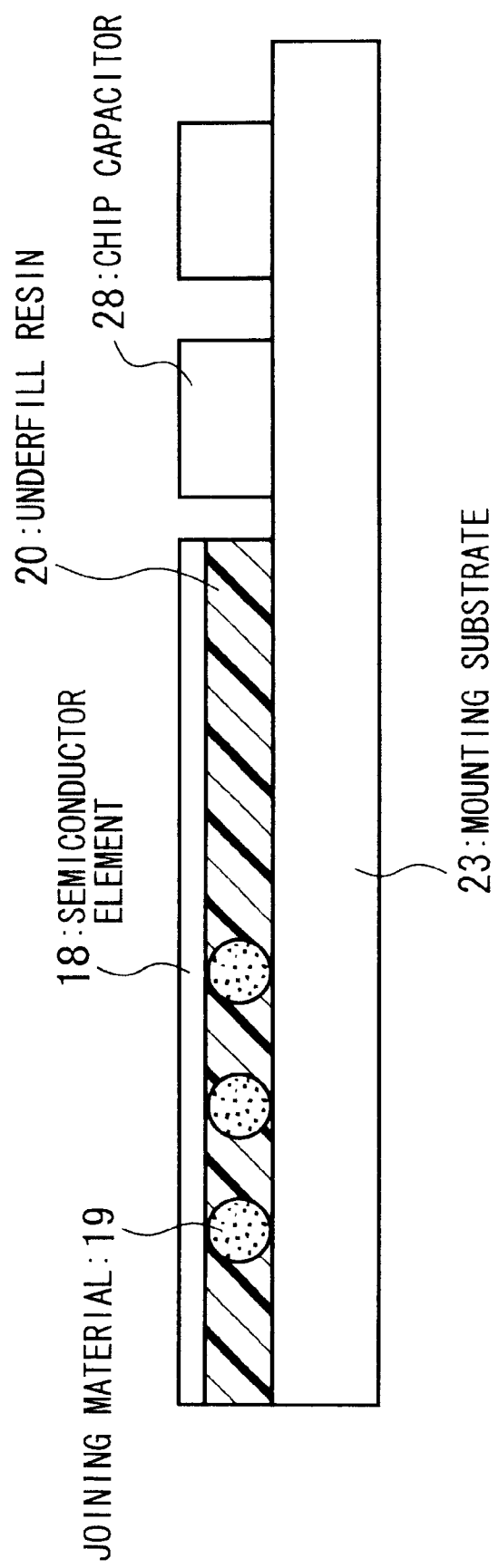
FIG. 19 is a cross-sectional structural view showing a mounting substrate onto which a chip capacitor is mounted, according to prior art.
Figure 20:
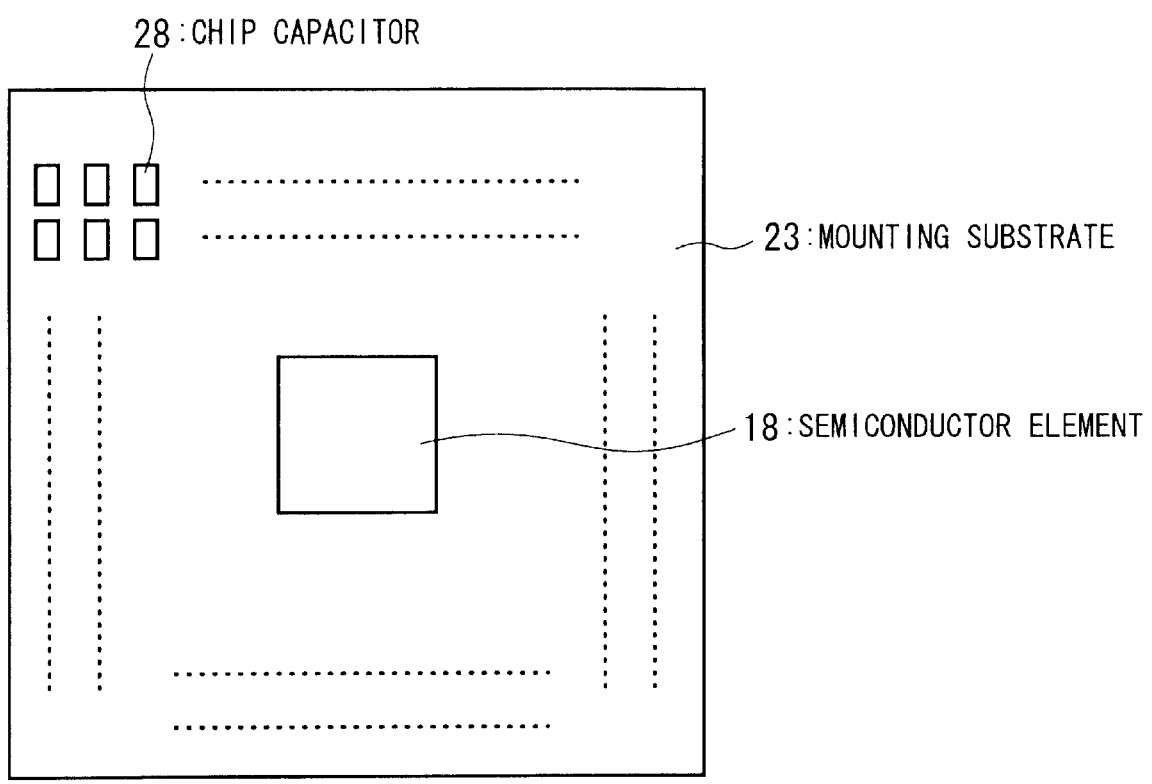
FIG. 20 is a plane view showing a mounting substrate onto which a chip capacitor is mounted, according to prior art.

Next, the structure in semiconductor element structure, to which is connected the above-noted fabricated capacitor, is connected to a mounting substrate, thereby obtaining the structure shown in FIG. 13. An evaluation of the variation in power supply voltage accompanying a change in clock frequency of the semiconductor element was performed with the semiconductor element mounted to the mounting substrate. The capacitance of the fabricated capacitor in this case was 1 $\mu$F, and the dielectric constant therein was calculated to be 150. The power supply voltage used for the semiconductor element was 1.8 V, the clock frequency was 500 MHz, and the maximum load current was 45 A. As a comparison, the power supply voltage was evaluated also for a mounting substrate onto which was mounted a capacitor of the past as shown in the structural plane view of FIG. 20. The chip capacitor component used measured 1.0 mm by 0.5 mm, had a capacitance of 10 nF, and a resonant frequency of 90 MHz. 100 of these capacitors were mounted to the mounting substrates shown in FIG. 19 and FIG. 20.

Figure 18:
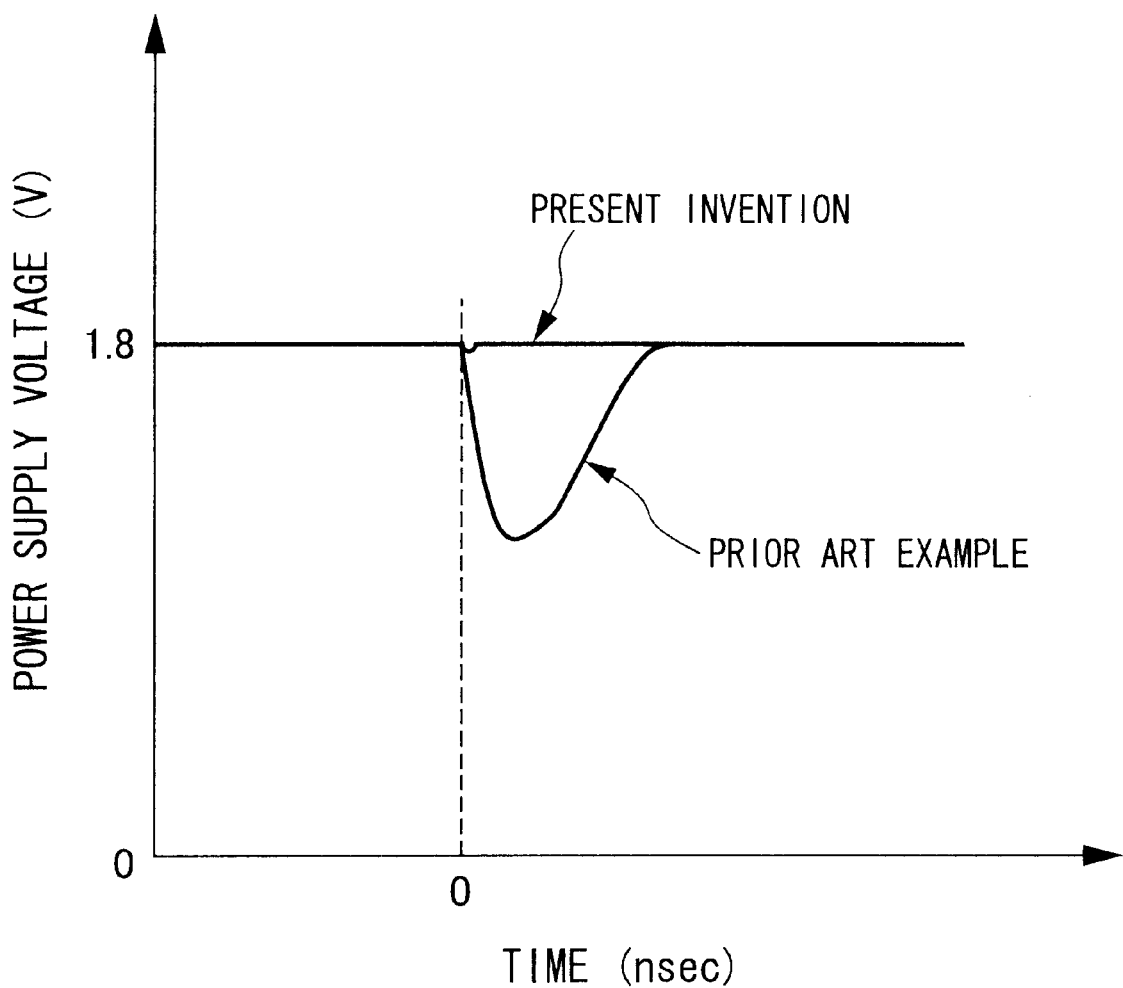
FIG. 18 is a graph showing the results of measuring the time variations of voltage in an embodiment of the present invention.

FIG. 18 shows the results of measurement of the time variations of the power supply voltage. The horizontal axis in this drawing represents time in nanoseconds, with time 0 being the start of clock operation. The vertical axis of this drawing represents the power supply voltage in volts, from which it can be seen that, before the start of clock operation, the potential was a constant 1.8 V. FIG. 18 shows the time variations of the voltage within one clock period.

From the results shown in FIG. 18, in the case of using a capacitor, a semiconductor device to which a capacitor is connected, or a capacitor mounting structure according to the present invention, there is almost no variation in power supply voltage. In contrast to this, with the example of the past, there is a prominent voltage drop accompanying clock operation. The causes of the voltage drop in the prior art are thought to be that, because the resonant frequency of the capacitor used was only 90 MHz, it was not possible to track to the clock operation frequency of 500 MHz, and the wiring inductance on the mounting substrate. With the present invention, however, because the capacitor is mounted in the space between the semiconductor element and the mounting substrate, it is possible to significantly reduce the mounting surface area and also to reduce the surface area of the mounting substrate itself.

The foregoing embodiments are presented as examples of the present invention, and should not be understood to restrict the present invention within the scope of the purport of the present invention, it being possible to embody the present invention in a number of various forms. For example, the materials and dimensions and the like of such elements as electrodes and the dielectric thin film presented in the foregoing embodiments are merely examples, and can be varied and changed.

A capacitor, a semiconductor element to which a capacitor is connected, and a mounting structure for a semiconductor element with a built-in capacitor or a capacitor according to the present invention, as described in detail above, achieve a number of effects. A first effect is that of being able to suppress a drop in the power supply voltage accompanying clock operation in a semiconductor element. The reasons for this are that the capacitor according to the present invention has a small ESL value as a component, and that, because direct connection is made to input and output pads of the semiconductor element 18 without intervening mounting substrate wiring there is no wiring inductance outside the semiconductor element. A second effect achieved by the present invention is that of reducing the surface area of the mounting substrate to which a capacitor according to the present invention is mounted, and achieving a reduction in the size and weight and high performance in the equipment in which the present invention is used. The reason for this is that the capacitor according to the present invention is interposed between semiconductor element and a mounting substrate, enabling mounting of the capacitor within the mounting surface area of the semiconductor element. It is additionally possible with a reduction in the size of the mounting substrate to reduce its weight, and also possible to shorten the wiring distance, thereby enabling the achievement of high performance.

An effect of a method for manufacturing a capacitor, a semiconductor element to which a capacitor is connected, a semiconductor package with a built-in capacitor, and a CSP with a built-in capacitor according to the present invention is that manufacturing does not require high dimensional precision. The reason for this is that manufacturing is done with a flexible organic film fixed to the wafer. An effect of another method for manufacturing a capacitor, a semiconductor element to which a capacitor is connected, a semiconductor package with a built-in capacitor, and a CSP with a built-in capacitor according to the present invention is an improvement in productivity and reduction in cost. The reason for this is that it is possible to perform continuous manufacturing, as the organic film, which is one of the fabricated elements, is moved from roll to roll.

What is claimed is:

1. A capacitor used in association with a semiconductor element, comprising:
   a lower electrode;
   a dielectric thin film;
   an upper electrode; and
   an insulation cover layer,
   said lower electrode, said dielectric thin film, and said insulation cover layer being formed onto an insulation substrate in said sequence,
   wherein a plurality of through holes corresponding to positions of input and output pads of said semiconductor element are formed through said insulation substrate, said lower electrode, said dielectric thin film, and said upper electrode, and
   wherein within a part of said through holes either said lower electrode or said upper electrode is exposed for the purpose of connection to input and output pads of said semiconductor element.

2. A capacitor according to claim 1,
   wherein one of said lower electrode and said upper electrode serves as a power supply plane and the other of said lower electrode and said upper electrode serves as a ground plane,
   wherein within said through holes corresponding to positions of power supply pads and ground pads of said semiconductor element said power supply plane and ground plane, respectively, are exposed,
   and wherein within said through holes corresponding to positions of a signal pad of said semiconductor element, neither said lower electrode nor said upper electrode is exposed.

3. A capacitor according to claim 1,
   wherein one of said lower electrode and said upper electrode serves as a power supply plane and the other of said power lower electrode and said upper electrode serves as a ground plane,
   wherein within said through holes corresponding to positions of power supply pads and grounds pads of said semiconductor element said power supply plane and ground plane, respectively, are exposed,
   and wherein within said through holes corresponding to positions of signal pads of said semiconductor element, a dummy electrode is provided, said dummy electrode being electrically connected to neither said lower electrode nor said upper electrode.

4. A capacitor according to claim 1,
   wherein one of said lower electrode and said upper electrode serves as a power supply plane and the other of said power lower electrode and said upper electrode serves as a ground plane,
   wherein within said through holes corresponding to positions of power supply pads and grounds pads of said semiconductor element said power supply plane and ground plane, respectively, are exposed,
   and wherein within said through holes corresponding to positions of signal pads of said semiconductor element, a dummy electrode is provided, said dummy electrode being connected via an intervening resistance to at least one of said lower electrode and said upper electrode.

5. A capacitor according to claim 1, wherein an adhesive is applied to at least one surface of a front surface and a rear surface thereof.

6. A capacitor according to claim 1 wherein, rather than at locations of input and output pads of said semiconductor element, a plurality of through holes are formed so as to correspond to positions of input and output terminals of a semiconductor device.

7. A capacitor according to claim 1, wherein a joining material for joining said input and output pads of said semiconductor element is formed within said through holes.

8. A semiconductor device, wherein a capacitor according to claim 1 is connected to input and output pads of said semiconductor element by a joining material via either said lower electrode or said upper electrode within said through hole.

9. A semiconductor device according to claim 8, wherein an underfill resin is filled in a space between said semiconductor element and said capacitor.

10. A semiconductor device according to claim 8, wherein said semiconductor element forms a package by sealing with a molded resin.

11. A semiconductor device wherein a capacitor according to claim 6 is connected to input and output terminals of semiconductor package by a joining material via either said lower electrode or said upper electrode within said through hole.

12. A capacitor mounting structure wherein a capacitor according to claim 1 is interposed between a semiconductor element and a mounting substrate, and wherein said capacitor is connected to both said semiconductor element and said mounting substrate by a joining material via either said lower electrode or said upper electrode within said through hole.

13. A capacitor mounting structure according to claim 12, wherein an underfill resin is filled in spaces formed between any two of said semiconductor element, said capacitor, and said mounting substrate.

14. A capacitor mounting structure wherein a capacitor according to claim 6 is interposed between a package and a mounting substrate, and wherein said capacitor is connected to both said package and said mounting substrate by a joining material via either said lower electrode or said upper electrode within said through hole.

15. A capacitor mounting structure according to claim 12, wherein said joining material is one of selected from a group consisting of solder, a metal bump, an electrically conductive adhesive, and an electrically conductive anisotropic resin.

16. A capacitor mounting structure wherein a capacitor according to claim 5 is interposed between a semiconductor element and a mounting substrate, wherein said capacitor is connected to both said semiconductor element and said mounting substrate by a joining material via either said lower electrode or said upper electrode within said through hole, and wherein an adhesive applied to a front and a rear surfaces of said capacitor is commonly used as either an underfill resin or a sealing resin.

17. A method for manufacturing a capacitor as defined by claim 2, which comprising the steps of:
   forming an organic film on a wafer;
   forming said lower electrode film;
   patterning said lower electrode film;
   forming said dielectric thin film;
   patterning said dielectric thin film;
   forming said upper electrode film;
   patterning said upper electrode film; and
   peeling said organic film from said wafer after all other said steps have been performed.

18. A method for manufacturing, a capacitor as defined by claim 2 with using a roll-to-roll process, which comprising the steps of:
   moving an organic film on a wafer;
   forming said lower electrode film;
   patterning said lower electrode film;
   forming said dielectric thin film;
   patterning said dielectric thin film;
   forming said upper electrode film; and
   patterning said upper electrode film.

19. A method for manufacturing a semiconductor device according to claim 8, comprising the steps of:
   forming said organic film on a wafer;
   forming said lower electrode film;
   patterning said lower electrode film;
   forming a dielectric thin film;
   patterning said dielectric thin film;
   forming said upper electrode film;
   patterning said upper electrode film;
   connecting said semiconductor element to said capacitor; and
   peeling said organic film from said wafer after all other said steps have been performed.

20. A method for manufacturing a semiconductor device as defined by claim 8, which comprising the steps of:
   moving an organic film from a supplying roll to a winding roll under a roll-to-roll process;
   forming said lower electrode film on said organic film;
   patterning said lower electrode film on said organic film;
   forming said dielectric thin film;
   patterning said dielectric thin film;
   forming said upper electrode film;
   patterning said upper electrode film; and
   connecting said semiconductor element to said capacitor film.

21. A method for manufacturing a semiconductor device as defined by claim 10, comprising the steps of;
   using a roll-to-roll process, according to comprising:
      moving an organic film from a supplying roll to a winding roll under a roll-to-roll process;
      patterning said lower electrode film;
      forming said dielectric thin film;
      patterning said dielectric thin film;
      forming said lower electrode film;
      patterning said lower electrode film;
      connecting said semiconductor element to said capacitor; and
      filling a space formed between said semiconductor element and said capacitor with underfilling or molding said semiconductor element.

22. A method for manufacturing a semiconductor device, comprising the steps of:
   distributing a joining material to said through hole of a capacitor as defined claim 1; and
   connecting said semiconductor element to said joint material.

* * * * *